(12) United States Patent
Kim et al.

(10) Patent No.: US 12,327,824 B2
(45) Date of Patent: Jun. 10, 2025

(54) SEMICONDUCTOR PACKAGE INCLUDING REDISTRIBUTION SUBSTRATE

(71) Applicant: SAMSUNG ELECTRONICS CO., LTD., Suwon-si (KR)

(72) Inventors: Dongkyu Kim, Anyang-si (KR); Daeho Lee, Hwaseong-si (KR); Seokhyun Lee, Hwaseong-si (KR); Minjung Kim, Gyeonggi-do (KR); Taewon Yoo, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 582 days.

(21) Appl. No.: 17/648,424

(22) Filed: Jan. 20, 2022

(65) Prior Publication Data
US 2022/0285328 A1 Sep. 8, 2022

(30) Foreign Application Priority Data
Mar. 8, 2021 (KR) ........................ 10-2021-0030289

(51) Int. Cl.
*H01L 25/10* (2006.01)
*H01L 23/00* (2006.01)
(Continued)

(52) U.S. Cl.
CPC ........ *H01L 25/105* (2013.01); *H01L 23/3128* (2013.01); *H01L 23/49894* (2013.01);
(Continued)

(58) Field of Classification Search
CPC .............. H01L 25/105; H01L 23/3128; H01L 23/49894; H01L 23/5383; H01L 23/5385;
(Continued)

(56) References Cited

U.S. PATENT DOCUMENTS 8,741,691 B2 * 6/2014 Yee ...................... H01L 21/565
257/E21.511
9,490,167 B2 11/2016 Chen et al.
(Continued)

FOREIGN PATENT DOCUMENTS

KR   10-1536045       7/2015
KR   10-1612220 B1    4/2016
(Continued)

OTHER PUBLICATIONS

Office Action dated Apr. 30, 2025 issued in Korean Patent Application No. 10-2021-0030289.

*Primary Examiner* — Vu A Vu
(74) *Attorney, Agent, or Firm* — MORGAN, LEWIS & BOCKIUS LLP

(57) ABSTRACT

A semiconductor package includes a lower semiconductor chip disposed on a lower redistribution substrate, lower solder patterns disposed between the lower redistribution substrate and the lower semiconductor chip, conductive structures disposed on the lower redistribution substrate, a lower molding layer disposed on the lower redistribution substrate and covering a top surface of the lower semiconductor chip, an upper redistribution substrate disposed on the lower molding layer and electrically connected to the conductive structures, an upper semiconductor chip disposed on the upper redistribution substrate, upper solder patterns disposed between the upper redistribution substrate and the upper semiconductor chip, and an upper molding layer disposed on the upper redistribution substrate and covering a sidewall of the upper semiconductor chip. The number of the conductive structures is greater than that of chip pads of the upper semiconductor chip.

20 Claims, 21 Drawing Sheets

(51) Int. Cl.
*H01L 23/31* (2006.01)
*H01L 23/498* (2006.01)
*H01L 23/538* (2006.01)

(52) U.S. Cl.
CPC ...... *H01L 23/5383* (2013.01); *H01L 23/5385* (2013.01); *H01L 23/5386* (2013.01); *H01L 24/16* (2013.01); *H01L 2224/16227* (2013.01)

(58) Field of Classification Search
CPC ............... H01L 23/5386; H01L 24/16; H01L 2224/16227; H01L 2224/023; H01L 2225/06589; H01L 23/5389; H01L 2225/06524; H01L 21/56; H01L 21/561; H01L 25/50; H01L 21/568; H01L 2221/68345; H01L 21/6835; H01L 23/36; H01L 23/49816; H01L 25/0652; H01L 25/0657; H01L 25/18; H01L 2225/06548; H01L 2225/06572; H01L 2225/1035; H01L 2225/1094; H01L 24/82; H01L 2224/82801; H01L 2225/1041; H01L 2225/1047
USPC .......................................... 257/172
See application file for complete search history.

(56) References Cited

U.S. PATENT DOCUMENTS

| | | | |
|---|---|---|---|
| 9,589,936 | B2 | 3/2017 | Zhai et al. |
| 9,633,939 | B2* | 4/2017 | Kim ..................... H01L 23/3128 |
| 9,633,974 | B2 | 4/2017 | Zhai et al. |
| 9,941,248 | B2* | 4/2018 | Yang ....................... H01L 24/17 |
| 10,109,567 | B2 | 10/2018 | Lin |
| 10,190,567 | B2 | 1/2019 | Pia et al. |
| 10,535,632 | B2* | 1/2020 | Jeng ....................... H01L 24/20 |
| 10,741,518 | B2 | 8/2020 | Min et al. |
| 11,296,004 | B2 | 4/2022 | Yoo et al. |
| 11,462,462 | B2 | 10/2022 | Yoo et al. |
| 11,824,040 | B2* | 11/2023 | Wu ..................... H01L 21/4857 |
| 2016/0343658 | A1 | 11/2016 | Lin et al. |
| 2016/0343685 | A1 | 11/2016 | Lin et al. |
| 2019/0189601 | A1 | 6/2019 | Kayashima |
| 2020/0006274 | A1 | 1/2020 | Chiang et al. |
| 2020/0008274 | A1 | 2/2020 | Chiang et al. |
| 2021/0098381 | A1* | 4/2021 | Yu ..................... H01L 21/4857 |

FOREIGN PATENT DOCUMENTS

| | | |
|---|---|---|
| KR | 10-2012443 | 8/2019 |
| KR | 10-2098593 | 4/2020 |
| KR | 10-2020-0134377 A | 12/2020 |
| KR | 10-2021-0011276 A | 2/2021 |

* cited by examiner

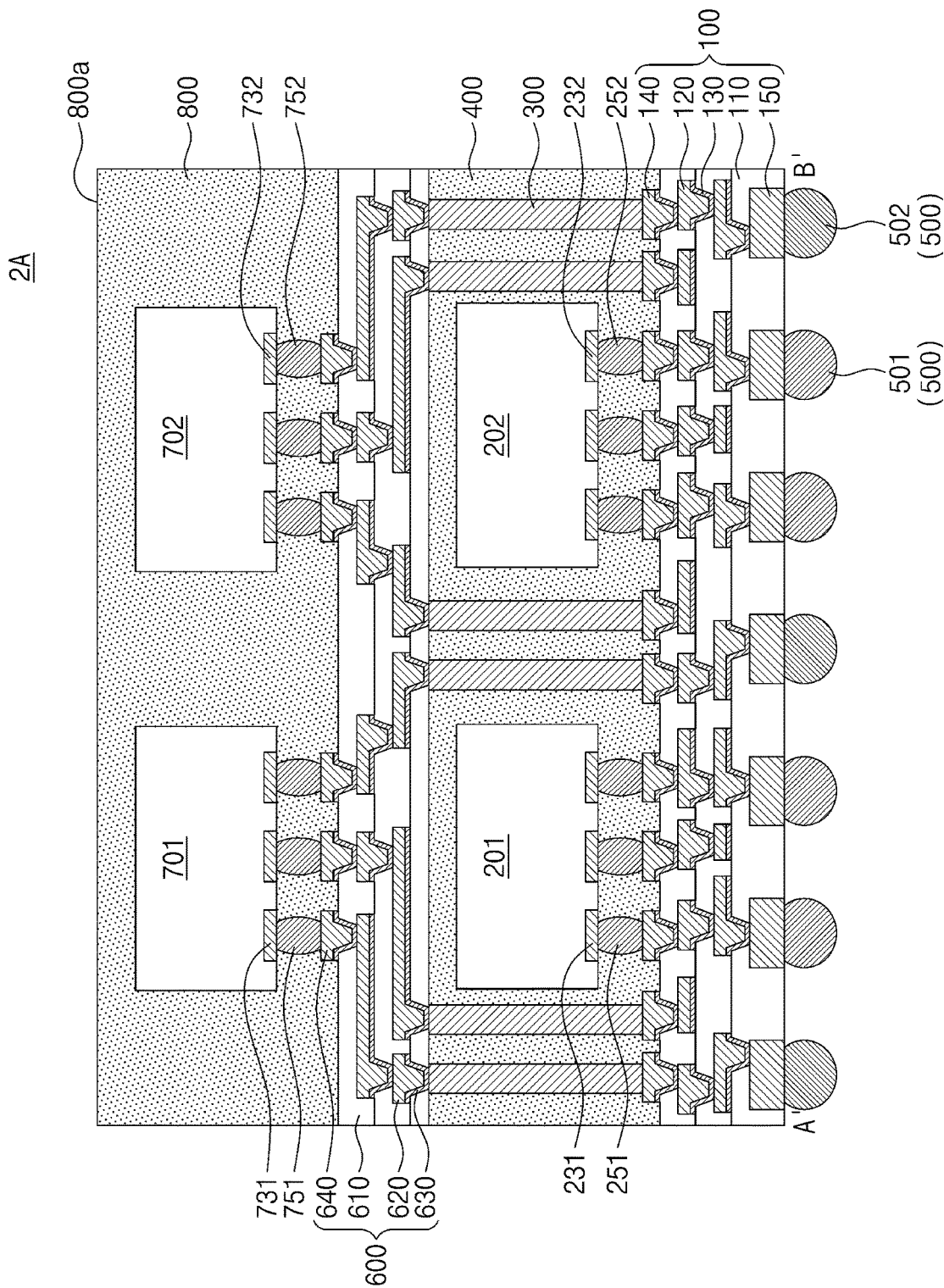

SEMICONDUCTOR PACKAGE INCLUDING REDISTRIBUTION SUBSTRATE

CROSS-REFERENCE TO RELATED APPLICATION

This U.S. nonprovisional application claims priority under 35 U.S.C § 119 to Korean Patent Application No. 10-2021-0030289, filed on Mar. 8, 2021 in the Korean Intellectual Property Office, the disclosure of which is hereby incorporated by reference in its entirety.

TECHNICAL FIELD

The present inventive concepts relate to a semiconductor package, and more particularly, to a semiconductor package including a redistribution substrate.

DISCUSSION OF THE RELATED ART

Semiconductor packages are used to protect and provide electrical connections for integrated circuit chips for use in electronic products. A semiconductor package may be used to mount a semiconductor chip on a printed circuit board. Bonding wires or bumps may then be used to electrically connect the semiconductor chip to the printed circuit board.

SUMMARY

A semiconductor package includes a lower redistribution substrate; a first lower semiconductor chip mounted on a top surface of the lower redistribution substrate; a plurality of first lower solder patterns disposed between the lower redistribution substrate and the first lower semiconductor chip; a plurality of conductive structures disposed on the top surface of the lower redistribution substrate and laterally spaced apart from the first lower semiconductor chip; a lower molding layer disposed on the top surface of the lower redistribution substrate, the lower molding layer covering sidewalls of the conductive structures and a top surface of the first lower semiconductor chip; an upper redistribution substrate disposed on the lower molding layer and the conductive structures, the upper redistribution substrate being electrically connected to the conductive structures; a first upper semiconductor chip mounted on a top surface of the upper redistribution substrate; a plurality of first upper solder patterns disposed between the upper redistribution substrate and the first upper semiconductor chip; and an upper molding layer covering a sidewall of the first upper semiconductor chip and exposing a top surface of the first upper semiconductor chip. The lower molding layer extends between the lower redistribution substrate and the first lower semiconductor chip and covers sidewalls of the first lower solder patterns. The upper molding layer extends between the upper redistribution substrate and the first upper semiconductor chip and covers sidewalls of the first upper solder patterns. Resistivity of the conductive structures is less than resistivity of the first lower solder patterns. The number of the conductive structures is the same as or greater than the number of a plurality of first upper chip pads of the first upper semiconductor chip. The lower redistribution substrate includes: a redistribution pattern disposed in a lower dielectric layer, the redistribution pattern including a via portion and a wire portion; and a seed pattern disposed on a bottom surface of the redistribution pattern. A width at a top surface of the via portion is greater than a width at a bottom surface of the via portion. The upper redistribution substrate includes: a redistribution layer disposed in an upper dielectric layer, the redistribution layer including a via pattern and a wire pattern; and an upper seed pattern disposed on a bottom surface of the redistribution layer. A width at a top surface of the via pattern is greater than a width at a bottom surface of the via pattern.

A semiconductor package includes a lower redistribution substrate; a first lower semiconductor chip mounted on a top surface of the lower redistribution substrate; a plurality of first lower solder patterns disposed between the lower redistribution substrate and the first lower semiconductor chip; a second lower semiconductor chip mounted on the top surface of the lower redistribution substrate; a plurality of second lower solder patterns disposed between the lower redistribution substrate and the second lower semiconductor chip; a conductive structure disposed on the top surface of the lower redistribution substrate; a lower molding layer disposed on the top surface of the lower redistribution substrate, the lower molding layer covering a top surface of the first lower semiconductor chip and a top surface of the second lower semiconductor chip; an upper redistribution substrate disposed on the lower molding layer and the conductive structure, the upper redistribution substrate being electrically connected to the conductive structure; a first upper semiconductor chip mounted on the upper redistribution substrate; a plurality of first upper solder patterns disposed between the upper redistribution substrate and the first upper semiconductor chip; a second upper semiconductor chip mounted on the upper redistribution substrate and laterally spaced apart from the first upper semiconductor chip; a plurality of second upper solder patterns disposed between the upper redistribution substrate and the second upper semiconductor chip; and an upper molding layer disposed on a top surface of the upper redistribution substrate, the upper molding layer covering a sidewall of the first upper semiconductor chip and a sidewall of the second upper semiconductor chip. The lower molding layer extends onto a bottom surface of the first lower semiconductor chip and a bottom surface of the second lower semiconductor chip and encapsulates the first lower solder patterns and the second lower solder patterns. The upper molding layer extends onto a bottom surface of the first upper semiconductor chip and a bottom surface of the second upper semiconductor chip and encapsulates the first upper solder patterns and the second upper solder patterns. In a plan view, the conductive structure is disposed between the first lower semiconductor chip and the second lower semiconductor chip. The lower redistribution substrate includes: a lower dielectric layer; a redistribution pattern disposed in the lower dielectric layer, the redistribution pattern including a via portion and a wire portion; and a seed pattern disposed on a bottom surface of the redistribution pattern. The upper redistribution substrate includes: an upper dielectric layer; a redistribution layer disposed in the upper dielectric layer, the redistribution layer including a via pattern and a wire pattern; and an upper seed pattern disposed on a bottom surface of the redistribution layer.

A semiconductor package includes: a lower redistribution substrate; a lower semiconductor chip mounted on a top surface of the lower redistribution substrate; a plurality of lower solder patterns disposed between the lower redistribution substrate and the lower semiconductor chip; a plurality of conductive structures disposed on the top surface of the lower redistribution substrate; a lower molding layer disposed on the top surface of the lower redistribution substrate, the lower molding layer covering a top surface of the lower semiconductor chip; an upper redistribution substrate disposed on the lower molding layer and the conductive structures, the upper redistribution substrate being electrically connected to the conductive structures; an upper semiconductor chip mounted on a top surface of the upper redistribution substrate; a plurality of upper solder patterns disposed between the upper redistribution substrate and the upper semiconductor chip; and an upper molding layer disposed on the top surface of the upper redistribution substrate, the upper molding layer covering a sidewall of the upper semiconductor chip. The lower molding layer extends between the lower redistribution substrate and the lower semiconductor chip and encapsulates the lower solder patterns. The upper molding layer extends between the upper redistribution substrate and the upper semiconductor chip and encapsulates the upper solder patterns. The number of the conductive structures is the same as or greater than the number of a plurality of upper chip pads of the upper semiconductor chip. The lower redistribution substrate includes: a redistribution pattern disposed in a lower dielectric layer, the redistribution pattern including a via portion and a wire portion; and a seed pattern disposed on a bottom surface of the redistribution pattern. The upper redistribution substrate includes: a redistribution layer disposed in an upper dielectric layer, the redistribution layer including a via pattern and a wire pattern; and a seed layer disposed on a bottom surface of the redistribution layer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIG. 4A is a cross-sectional view showing a semiconductor package according to some example embodiments;

DETAILED DESCRIPTION OF EMBODIMENTS

Figure 1A:
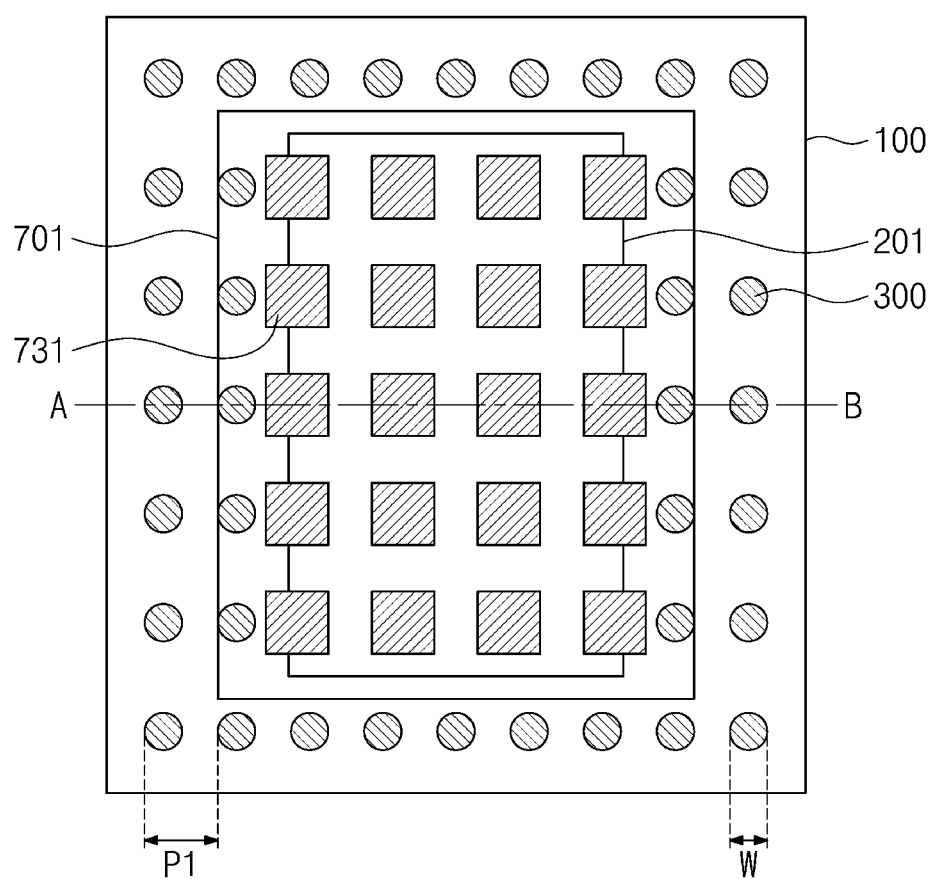
FIG. 1A is a plan view showing a semiconductor package according to some example embodiments.

In this description and the drawings, like reference numerals may refer like components. The following will now describe semiconductor packages and their fabricating methods according to the present inventive concepts.

Figure 1B:
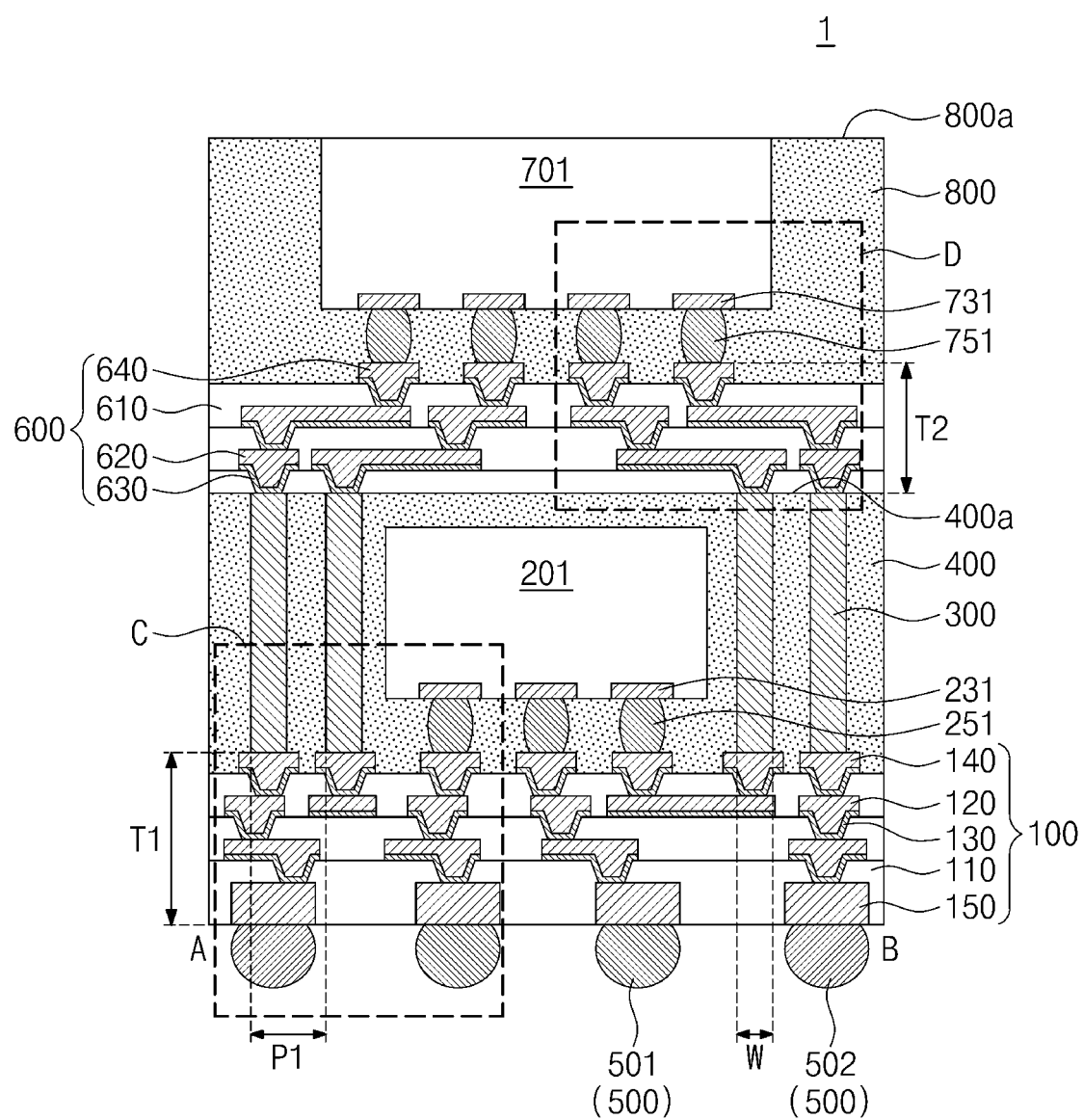
FIG. 1B is a cross-sectional view taken along line A-B of FIG. 1A.
Figure 1C:
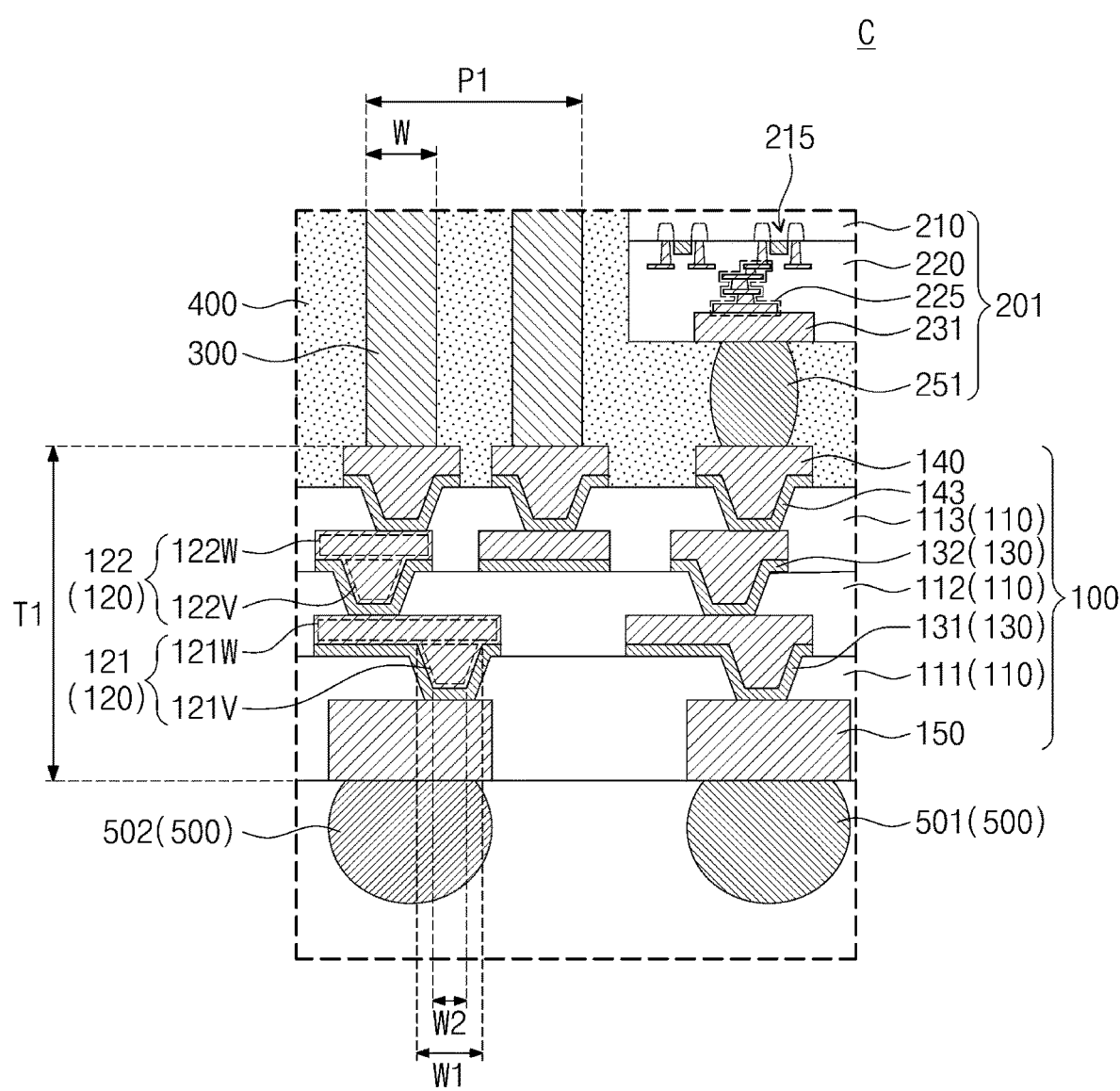
FIG. 1C is an enlarged view showing section C of FIG. 1B.
Figure 1D:
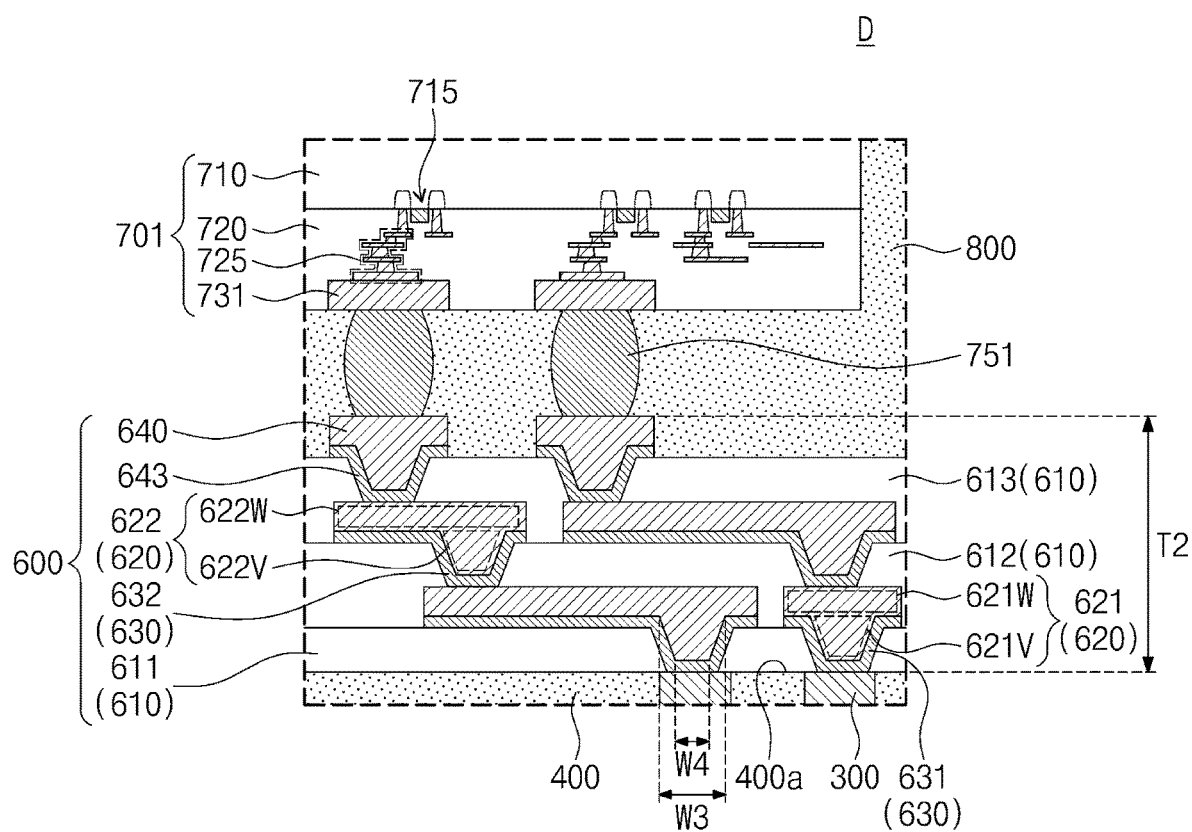
FIG. 1D is an enlarged view showing section D of FIG. 1B.

FIG. 1A is a plan view showing a semiconductor package according to some example embodiments. FIG. 1B is a cross-sectional view taken along line A-B of FIG. 1A. FIG. 1C is an enlarged view showing section C of FIG. 1B. FIG. 1D is an enlarged view showing section D of FIG. 1B.

Referring to FIGS. 1A to 1D, a semiconductor package 1 may include a lower package and an upper package. The lower package may include a lower redistribution substrate 100, a first lower semiconductor chip 201, first lower solder patterns 251, conductive structures 300, and a lower molding layer 400. The upper package may include an upper redistribution substrate 600, a first upper semiconductor chip 701, first upper solder patterns 751, and an upper molding layer 800.

The lower redistribution substrate 100 may include a lower dielectric layer 110, under-bump patterns 150, redistribution patterns 120, seed patterns 130, and redistribution pads 140. The lower dielectric layer 110 may include an organic material, such as a photosensitive polymer or photo-imageable polymer. The photosensitive polymer may include, for example, photosensitive polyimide, polybenzoxazole, phenolic polymers, and/or benzocyclobutene polymers. The lower dielectric layer 110 may be provided in plural. For example, the plurality of lower dielectric layers 110 may include the same material. No distinct interface might be provided between neighboring lower dielectric layers 110. For example, as shown in FIG. 1C, the lower dielectric layer 110 may include a first lower dielectric layer 111, a second lower dielectric layer 112, and a third lower dielectric layer 113. The second lower dielectric layer 112 may be disposed between the first lower dielectric layer 111 and the third lower dielectric layer 113. The first lower dielectric layer 111 may be a lowermost one of the lower dielectric layers 110. The third lower dielectric layer 113 may be an uppermost one of the lower dielectric layers 110. The number of the stacked lower dielectric layers 110 may be variously changed.

The under-bump patterns 150 may be provided in the lowermost one of the lower dielectric layers 110. The under-bump patterns 150 may have bottom surfaces that are not covered with the lower dielectric layers 110. The under-bump patterns 150 may serve as pads for solder terminals 500. The under-bump patterns 150 may be laterally spaced apart and electrically insulated from each other. The phrase "two components are laterally spaced apart from each other" may mean "the two components are horizontally spaced apart from each other." The term "horizontally" may indicate "parallel to a bottom surface of the first lower dielectric layer 111." The first lower dielectric layer 111 may cover top surfaces and sidewalls of the under-bump patterns 150. The under-bump patterns 150 may include a metallic material such as copper. The under-bump patterns 150 may alternatively be disposed on the bottom surface of the first lower dielectric layer 111.

As shown in FIG. 1C, the redistribution patterns 120 may include first redistribution patterns 121 and second redistribution patterns 122. The first redistribution patterns 121 may be disposed on, and correspond with, the under-bump patterns 150. The first redistribution patterns 121 may be laterally spaced apart and electrically separated from each other. The first redistribution patterns 121 may be disposed on a top surface and inside of the first lower dielectric layer 111. Each of the first redistribution patterns 121 may include a first via portion 121V and a first wire portion 121W. The first via portion 121V may be disposed in the first lower dielectric layer 111 and on the top surface of a corresponding under-bump pattern 150. The first via portion 121V may have a width W1 at its top surface greater than a width W2 at its bottom surface. The top and bottom surfaces of the first via portion 121V may be opposite to each other. The top surface of the first via portion 121V may be an imaginary surface that may be disposed at the same level as that of a bottom surface of the first wire portion 121W. The first wire portion 121W may be provided on the first via portion 121V, and the first wire portion 121W and the first via portion 121V may be connected to each other with no boundary therebetween. The first wire portion 121W may have a width that is greater than the width W1 at the top surface of the first via portion 121V. The first wire portion 121W may extend onto the top surface of the first lower dielectric layer 111 and may have a major axis that extends in a first direction. The first direction may be parallel to the bottom surface of the first lower dielectric layer 111. The first redistribution patterns 121 may include metal such as copper. In this description, the element "via" may be a constituent for vertical connection, and the element "wire" may be a constituent for horizontal connection. The term "vertical" may mean "perpendicular to the bottom surface of the first lower dielectric layer 111." In this description, the language "level" may denote "vertical level", and "level difference" may be measured in a direction perpendicular to the bottom surface of the first lower dielectric layer 111. The phrase "certain components are the same in terms of level and width" may include an allowable tolerance possibly occurring during fabrication process.

The first lower dielectric layer 111 may be provided thereon with the second lower dielectric layer 112 that covers the top surface and a sidewall of the first wire portion 121W.

The seed patterns 130 may include first seed patterns 131 and second seed patterns 132. The first seed patterns 131 may be disposed on, and may correspond to, bottom surfaces of the first redistribution patterns 121. For example, each of the first seed patterns 131 may be interposed between a corresponding under-bump pattern 150 and a corresponding first via portion 121V, and may cover a sidewall of the first via portion 121V and the bottom surface of the first wire portion 121W. Each of the first seed patterns 131 might not extend onto the sidewall of a corresponding first wire portion 121W. The first seed patterns 131 may include a material different from that of the under-bump patterns 150 and that of the first redistribution patterns 121. For example, the first seed patterns 131 may include a conductive seed material. The conductive seed material may include copper, and/or titanium, and/or any alloy thereof. The first seed patterns 131 may serve as barrier layers to prevent diffusion of materials included in the first redistribution patterns 121.

The second redistribution patterns 122 may be disposed on, may correspond to, and may be electrically connected to the first redistribution patterns 121. Each of the second redistribution patterns 122 may include a second wire portion 122W and a second via portion 122V. The second via portion 122V may be provided in the second lower dielectric layer 112 and may be coupled to a corresponding first redistribution pattern 121. The second via portion 122V may have a width at its top surface that is greater than a width at its bottom surface. The top and bottom surfaces of the second via portion 122V may be opposite to each other. The top surface of the second via portion 122V may be an imaginary surface disposed at the same level as that of a bottom surface of the second wire portion 122W. The second wire portion 122W may be provided on the second via portion 122V, and the second wire portion 122W and the second via portion 122V may be connected to each other with no boundary therebetween. The second wire portion 122W may have a width that is greater than the width at the top surface of the second via portion 122V. The second wire portion 122W may extend onto a top surface of the second lower dielectric layer 112. The second redistribution patterns 122 may include metal such as copper.

The second seed patterns 132 may be disposed on, and may correspond to, bottom surfaces of the second redistribution patterns 122. The second seed patterns 132 may be interposed between, and may correspond to, the first redistribution patterns 121 and the second redistribution patterns 122. For example, each of the second seed patterns 132 may cover the bottom surface and a sidewall of a corresponding second via portion 122V and may also cover the bottom surface of a corresponding second wire portion 122W. Each of the second seed patterns 132 might not extend onto a sidewall of the corresponding second wire portion 122W. The second seed patterns 132 may include, for example, a conductive seed material. The second seed patterns 132 may serve as barrier layers to prevent diffusion of materials included in the second redistribution patterns 122.

The number of the stacked redistribution patterns 120 may be variously changed. For example, the redistribution patterns 120 may further include third redistribution patterns. In this case, the third redistribution patterns may be interposed between, and may correspond to, the first redistribution patterns 121 and the second redistribution patterns 122.

The third lower dielectric layer 113 may be provided on the top surface of the second lower dielectric layer 112 and may cover the second redistribution patterns 122.

The redistribution pads 140 may be provided on and coupled to corresponding second redistribution patterns 122. The redistribution pads 140 may be laterally spaced apart from each other. As the redistribution patterns 120 are provided, at least one redistribution pad 140 might not be vertically aligned with the under-bump pattern 150 electrically connected thereto. Therefore, it may be possible to freely design an arrangement of the under-bump patterns 150 and/or the redistribution pads 140.

The redistribution pads 140 may be provided in the third lower dielectric layer 113 and may extend onto a top surface of the third lower dielectric layer 113. Each of the redistribution pads 140 may have a lower portion that is disposed in the third lower dielectric layer 113. Each of the redistribution pads 140 may have an upper portion that is disposed on the top surface of the third lower dielectric layer 113. Each of the redistribution pads 140 may be configured such that the upper portion may have a width that is greater than that of the lower portion, and that the upper portion may be connected to the lower portion. The redistribution pads 140 may include metal such as copper. The lower redistribution substrate 100 may further include seed pads 143. The seed pads 143 may be provided on, and may correspond to, bottom surfaces of the redistribution pads 140. The seed pads 143 may be provided between, and may correspond to, the second redistribution patterns 122 and the redistribution pads 140, and may extend between the third lower dielectric layer 113 and the redistribution pads 140. The seed pads 143 may include a different material from that of the redistribution pads 140. The seed pads 143 may include, for example, a conductive seed material. The lower redistribution substrate 100 may further include bonding pads that are provided on, and may correspond to, top surfaces of the redistribution pads 140. The bonding pads may include a different material from that of the redistribution pads 140. For example, the bonding pads may include nickel and/or gold, and/or any alloy thereof. The bonding pads may serve as protection layers and/or adhesion layers.

The lower redistribution substrate 100 may have a first thickness T1. A thickness of a certain component may be measured in a direction substantially perpendicular to a bottom surface of the certain component. A thickness of a certain component may correspond to an interval between top and bottom surfaces of the certain component. For example, the first thickness T1 may correspond to an interval between a bottom surface of the lowermost lower dielectric layer 110 (or the first lower dielectric layer 111) and the top surfaces of the redistribution pads 140. The first thickness T1 may range from about 10 μm to about 50 μm. As the first thickness T1 is equal to or less than about 50 μm, the semiconductor package 1 may be small in size.

As shown in FIG. 1B, the first lower semiconductor chip 201 may be mounted on a top surface of the lower redistribution substrate 100. In a plan view, the first lower semiconductor chip 201 may be disposed on a central region of the lower redistribution substrate 100. The first lower semiconductor chip 201 may be a logic chip, a buffer chip, and/or a memory chip. The first lower semiconductor chip 201 may have top and bottom surfaces that are opposite to each other. The bottom surface of the first lower semiconductor chip 201 may be directed toward the lower redistribution substrate 100 and may be an active surface. The top surface of the first lower semiconductor chip 201 may be an inactive surface. For example, as shown in FIG. 1C, the first lower semiconductor chip 201 may include a lower semiconductor substrate 210, a lower wiring layer, lower integrated circuits 215, and first lower chip pads 231. The lower integrated circuits 215 may be disposed on a bottom surface of the lower semiconductor substrate 210. The lower integrated circuits 215 may include logic circuits, memory circuits, or any combination thereof. The lower wiring layer may be disposed on the bottom surface of the lower semiconductor substrate 210. The lower wiring layer may include a lower dielectric pattern 220 and lower wiring structures 225. The lower wiring structures 225 may be disposed in the lower dielectric pattern 220. The first lower chip pads 231 may be disposed on a bottom surface of the lower wiring layer. The first lower chip pads 231 may be coupled through the lower wiring structures 225 to the lower integrated circuits 215. The phrase "a certain component is electrically connected to a semiconductor chip" may mean "the certain component is electrically connected through chip pads of the semiconductor chip to integrated circuits of the semiconductor chip."

As shown in FIG. 1B, the first lower solder patterns 251 may be interposed between the lower redistribution substrate 100 and the first lower semiconductor chip 201. The first lower solder patterns 251 may be provided between, may correspond to, and may be coupled to the redistribution pads 140 and the first lower chip pads 231. Therefore, the first lower semiconductor chip 201 may be coupled through the first lower solder patterns 251 to the lower redistribution substrate 100. The phrase "coupled to the lower redistribution substrate 100" may indicate "coupled to at least one of the redistribution patterns 120." The number of the first lower solder patterns 251 may be the same as the number of the first lower chip pads 231, but the present inventive concepts are not necessarily limited thereto. Each of the first lower solder patterns 251 may have a solder ball shape and may include a solder material. In this description, the solder material may include tin, bismuth, lead, silver, or any alloy thereof.

The first lower solder patterns 251, the redistribution pads 140, and the redistribution patterns 120 may have high thermal conductivity. For example, the thermal conductivity of the first lower solder patterns 251, of the redistribution pads 140, and of the redistribution patterns 120 may be greater than that of the lower molding layer 400. Accordingly, when the semiconductor package 1 operates, heat generated from the first lower semiconductor chip 201 may be promptly discharged to the outside through the first lower solder patterns 251, the redistribution pads 140, and the redistribution patterns 120. As the first thickness T1 is equal to or less than about 50 μm, the first lower semiconductor chip 201 may achieve greater thermal radiation.

The conductive structures 300 may be provided on the top surface of the lower redistribution substrate 100. In a plan view, the conductive structures 300 may be disposed on an edge region of the lower redistribution substrate 100. In a plan view, the edge region may surround the central region of the lower redistribution substrate 100. The conductive structures 300 may be laterally spaced apart from the first lower semiconductor chip 201. The conductive structures 300 may be laterally spaced apart from each other. The conductive structures 300 may be disposed on and coupled to corresponding redistribution pads 140. The conductive structures 300 may be electrically connected to the redistribution patterns 120.

The conductive structures 300 may have top surfaces at a higher level than that of a top surface of the first lower semiconductor chip 201. The conductive structures 300 may have heights greater than those of the first lower solder patterns 251. The conductive structures 300 may include a different material from that of the first lower solder patterns 251. For example, the conductive structures 300 may include copper and/or tungsten, and alloys thereof.

It may be required that the conductive structures 300 have heights the same as or similar to an interval between the lower redistribution substrate 100 and the upper redistribution substrate 600. When the lower redistribution substrate 100 and the upper redistribution substrate 600 are connected to each other through solder balls, the interval between the lower redistribution substrate 100 and the upper redistribution substrate 600 may induce an increase in pitch and width of the solder balls. According to some example embodiments, the conductive structures 300 may be metal pillars. The conductive structures 300 may have the same width W. For example, the conductive structures 300 may have widths at their top surfaces substantially the same as widths at their bottom surfaces. The conductive structures 300 may have a fine pitch P1. For example, the pitch P1 of the conductive structures 300 may range from about 70 μm to about 350 μm. The conductive structures 300 may each have a small width W. For example, the width W of the conductive structure 300 may range from about 50 μm to about 250 μm. As the conductive structures 300 have the pitch P1 equal to or less than about 350 μm and the width W equal to or less than about 250 μm, the conductive structures 300 may be densely disposed. The semiconductor package 1 may decrease in planar area and size.

The lower molding layer 400 may be formed on the lower redistribution substrate 100 and may cover the first lower semiconductor chip 201. For example, the lower molding layer 400 may cover the top surface and a sidewall of the first lower semiconductor chip 201. The lower molding layer 400 may have a top surface 400a at a higher level than that of the top surface of the first lower semiconductor chip 201. The lower molding layer 400 may extend into a gap between the lower redistribution substrate 100 and the first lower semiconductor chip 201, and may cover a bottom surface of the first lower semiconductor chip 201 and sidewalls of the first lower solder patterns 251. The lower molding layer 400 may encapsulate and protect the first lower solder patterns 251. Therefore, it might not be necessary to separately form an under-fill layer and accordingly it may be possible to fabricate the semiconductor package 1 more simply.

The lower molding layer 400 may cover sidewalls of the conductive structures 300, but may expose the top surfaces of the conductive structures 300. The top surface 400*a* of the lower molding layer 400 may be located at substantially the same level as that of the top surface of the conductive structures 300. The lower molding layer 400 may include a dielectric polymer, such as an epoxy-based molding compound.

The upper redistribution substrate 600 may be disposed on the lower molding layer 400 and the conductive structures 300. The upper redistribution substrate 600 may be spaced apart from the top surface of the first lower semiconductor chip 201. A conductive component, such as solder or bump, might not be provided between the first lower semiconductor chip 201 and the upper redistribution substrate 600. The lower molding layer 400 may fill a gap between the upper redistribution substrate 600 and the top surface of the first lower semiconductor chip 201.

The upper redistribution substrate 600 may include an upper dielectric layer 610, upper redistribution layers 620, upper seed patterns 630, and upper redistribution pads 640. The upper dielectric layer 610 may include a plurality of upper dielectric layers, and the plurality of upper dielectric layers 610 may be stacked on the lower molding layer 400. The upper dielectric layers 610 may include an organic material, such as a photosensitive polymer or photo-imageable polymer. For example, the upper dielectric layers 610 may include the same material. No distinct interface might be provided between neighboring upper dielectric layers 610. For example, as shown in FIG. 1D, the upper dielectric layers 610 may include a first upper dielectric layer 611, a second upper dielectric layer 612, and a third upper dielectric layer 613. The first upper dielectric layer 611 may be a lowermost one of the upper dielectric layers 610. The first upper dielectric layer 611 may be in direct physical contact with the top surface 400*a* of the lower molding layer 400. The third upper dielectric layer 613 may be an uppermost one of the upper dielectric layers 610. The second upper dielectric layer 612 may be disposed between the first upper dielectric layer 611 and the third upper dielectric layer 613. The number of the stacked upper dielectric layers 610 may be variously changed.

The upper redistribution layers 620 may include first upper redistribution layers 621 and second upper redistribution layers 622. The first upper redistribution layers 621 may be provided on corresponding conductive structures 300. The first upper redistribution layers 621 may be laterally spaced apart and electrically separated from each other. Referring to FIG. 1D, each of the first upper redistribution layers 621 may include a first via pattern 621V and a first wire pattern 621W. The first via pattern 621V may be disposed on the top surface of a corresponding conductive structure 300. The first via pattern 621V may be provided in the first upper dielectric layer 611. The first via pattern 621V may have a width W3 at its top surface greater than a width W4 at its bottom surface. The top and bottom surfaces of the first via pattern 621V may be opposite to each other. The top surface of the first via pattern 621V may be an imaginary surface located at substantially the same level as that of a bottom surface of the first wire pattern 621W. The first wire pattern 621W may be provided on the first via pattern 621V, and the first wire pattern 621W and the first via pattern 621V may be connected to each other with no boundary therebetween. The first wire pattern 621W may have a width that is greater than the width W3 at the top surface of the first via pattern 621V. The first wire pattern 621W may extend onto a top surface of the first upper dielectric layer 611. The first upper redistribution layers 621 may include metal such as copper. On the first upper dielectric layer 611, the second upper dielectric layer 612 may cover a top surface and a sidewall of the first wire pattern 621W.

The upper seed patterns 630 may include first upper seed patterns 631 and second upper seed patterns 632. The first upper seed patterns 631 may be disposed on and may correspond to bottom surfaces of the first upper redistribution layers 621. For example, each of the first upper seed patterns 631 may be interposed between a corresponding conductive structure 300 and a corresponding first via pattern 621V, and may extend onto a sidewall of the first via pattern 621V and the bottom surface of the first wire pattern 621W. Each of the first upper seed patterns 631 might not cover the sidewall of a corresponding first wire pattern 621W. The first upper seed patterns 631 may include a different material from that of the conductive structures 300 and that of the first upper redistribution layers 621. For example, the first upper seed patterns 631 may include a conductive seed material. The first upper seed patterns 631 may serve as barrier layers to prevent diffusion of materials included in the first upper redistribution layers 621.

The second upper redistribution layers 622 may be disposed on, may correspond to, and may be electrically connected to the first upper redistribution layers 621. Each of the second upper redistribution layers 622 may include a second wire pattern 622W and a second via pattern 622V. The second via pattern 622V may be provided on the second upper dielectric layer 612 and may be coupled to the first upper redistribution layer 621. The second via pattern 622V may have a width at its top surface that is greater than a width at its bottom surface. The top and bottom surfaces of the second via pattern 622V may be opposite to each other. The top surface of the second via pattern 622V may be an imaginary surface located at substantially the same level as that of a bottom surface of the second wire pattern 622W. The second wire pattern 622W may be provided on the second via pattern 622V, and the second wire pattern 622W and the second via pattern 622V may be connected to each other with no boundary therebetween. The second wire pattern 622W may have a width that is greater than the width at the top surface of the second via pattern 622V. The second wire pattern 622W may extend onto a top surface of the second upper dielectric layer 612. The second upper redistribution layers 622 may include metal such as copper.

The second upper seed patterns 632 may be disposed on and may correspond to bottom surfaces of the second upper redistribution layers 622. The second upper seed patterns 632 may be interposed between, and may correspond to, the first upper redistribution layers 621 and the second upper redistribution layers 622. Each of the second upper seed patterns 632 may cover the bottom surface and a sidewall of a corresponding second via pattern 622V and may also cover the bottom surface of the second wire pattern 622W. The second upper seed patterns 632 may include a different material from that of the second upper redistribution layers 622. The second upper seed patterns 632 may include, for example, a conductive seed material. The second upper seed patterns 632 may serve as barrier layers to prevent diffusion of materials included in the second upper redistribution layers 622.

The second upper dielectric layer 612 may be provided on its top surface with the third upper dielectric layer 613 that covers the second upper dielectric layers 622.

The upper redistribution pads 640 may be disposed on, may correspond to, and may be coupled to the second upper redistribution layers 622. The upper redistribution pads 640 may be laterally spaced apart from each other. As the upper redistribution layers 620 are provided, at least one upper redistribution pad 640 might not be vertically aligned with the conductive structure 300 electrically connected thereto. Therefore, it may be possible to freely design an arrangement of the upper redistribution pads 640.

Each of the upper redistribution pads 640 may have a lower portion that is provided in the third upper dielectric layer 613. Each of the upper redistribution pads 640 may have an upper portion that is disposed on a top surface of the third upper dielectric layer 613. Each of the upper redistribution pads 640 may be configured such that the upper portion may have a width that is greater than that of the lower portion, and that the upper portion may be connected to the lower portion. The upper redistribution pads 640 may include metal such as copper.

The upper redistribution substrate 600 may further include upper seed pads 643. The upper seed pads 643 may be interposed between, and may correspond to, the second upper redistribution layers 622 and the upper redistribution pads 640, and may extend between the third upper dielectric layer 613 and the upper redistribution pads 640. The upper seed pads 643 may include a different material from that of the upper redistribution pads 640. The upper seed pads 643 may include, for example, a conductive seed material. The upper redistribution substrate 600 may further include upper bonding pads. The upper bonding pads may be provided on, and may correspond to, top surfaces of the upper redistribution pads 640. The upper bonding pads may include a different material from that of the upper redistribution pads 640. For example, the upper bonding pads may include nickel and/or gold, or an alloy thereof.

The upper redistribution substrate 600 may have a second thickness T2. For example, the second thickness T2 may correspond to an interval between a bottom surface of the lowermost upper dielectric layer 610 and the top surfaces of the upper redistribution pads 640. The second thickness T2 may range from about 10 μm to about 50 μm. As the second thickness T2 is equal to or less than about 50 μm, the semiconductor package 1 may become small in size.

There may be various changes in the number of the upper redistribution layers 620 provided between, and may correspond to, the conductive structures 300 and the upper redistribution pads 640.

As shown in FIG. 1B, the first upper semiconductor chip 701 may be mounted on a top surface of the upper redistribution substrate 600. The first upper semiconductor chip 701 may be a logic chip, a buffer chip, and/or a memory chip. For example, the first upper semiconductor chip 701 may be of a different type from the first lower semiconductor chip 201. The first upper semiconductor chip 701 may be one of logic and memory chips, and the first lower semiconductor chip 201 may be the other of logic and memory chips. Alternatively, the first upper semiconductor chip 701 may be of the same type as the first lower semiconductor chip 201.

The first upper semiconductor chip 701 may have top and bottom surfaces that are opposite to each other. The bottom surface of the first upper semiconductor chip 701 may be directed toward the upper redistribution substrate 600 and may be an active surface. The top surface of the first upper semiconductor chip 701 may be an inactive surface. For example, as shown in FIG. 1D, the first upper semiconductor chip 701 may include an upper semiconductor substrate 710, an upper wiring layer, upper integrated circuits 715, and first upper chip pads 731. The upper integrated circuits 715 may be provided on a bottom surface of the upper semiconductor substrate 710. The upper integrated circuits 715 may include transistors. The upper wiring layer may be disposed on the bottom surface of the upper semiconductor substrate 710. The upper wiring layer may include an upper dielectric pattern 720 and upper wiring structures 725. The upper wiring structures 725 may be provided in the upper dielectric pattern 720. The first upper chip pads 731 may be disposed on a bottom surface of the upper wiring layer. The first upper chip pads 731 may be coupled through the upper wiring structures 725 to the upper integrated circuits 715.

The first upper solder patterns 751 may be interposed between the upper redistribution substrate 600 and the first upper semiconductor chip 701. The first upper solder patterns 751 may be provided between, may correspond to, and may be coupled to the upper redistribution pads 640 and the first upper chip pads 731. Therefore, the first upper semiconductor chip 701 may be coupled through the first upper solder patterns 751 to the upper redistribution substrate 600. The phrase "coupled to the upper redistribution substrate 600" may indicate "coupled to at least one of the upper redistribution layers 620." Each of the first upper solder patterns 751 may have a solder ball shape and may include a solder material. The number of the first upper solder patterns 751 may be the same as the number of the first upper chip pads 731, but the present inventive concepts are not necessarily limited thereto.

As shown in FIG. 1B, the upper molding layer 800 may be formed on the upper redistribution substrate 600 and may cover a sidewall of the first upper semiconductor chip 701. The upper molding layer 800 may expose a top surface of the first upper semiconductor chip 701. The upper molding layer 800 may have a top surface 800a at substantially the same level as that of the top surface of the first upper semiconductor chip 701. The upper molding layer 800 may have a relatively low thermal conductivity. As the upper molding layer 800 exposes the top surface of the first upper semiconductor chip 701, heat generated from the first upper semiconductor chip 701 may be promptly discharged to the outside. Therefore, the first upper semiconductor chip 701 may achieve greater thermal radiation. The upper molding layer 800 may extend between the first upper semiconductor chip 701 and the upper redistribution substrate 600, and may cover a bottom surface of the first upper semiconductor chip 701 and sidewalls of the first upper solder patterns 751. The upper molding layer 800 may encapsulate and protect the first upper solder patterns 751. Thus, it might not be necessary to form an under-fill layer between the first upper semiconductor chip 701 and the upper redistribution substrate 600, and accordingly it may be possible to more simply fabricate the semiconductor package 1.

The upper molding layer 800 may have outer sidewalls that are vertically aligned with those of the upper redistribution substrate 600, those of the lower molding layer 400, and those of the lower redistribution substrate 100.

The solder terminals 500 may be provided on the bottom surface of the lower redistribution substrate 100. The solder terminals 500 may be disposed on and may correspond to bottom surfaces of the under-bump patterns 150 and may be coupled to corresponding members of the under-bump patterns 150. The solder terminals 500 may be electrically connected through the under-bump patterns 150 to the redistribution patterns 120. The solder terminals 500 may be laterally spaced apart and electrically separated from each other. The solder terminals 500 may include a solder material.

The solder terminals 500 may include first solder terminals 501 and second solder terminals 502. The first solder terminals 501 may be disposed on the bottom surface at the central region of the lower redistribution substrate 100. The first solder terminals 501 may vertically overlap the first lower semiconductor chip 201. The first solder terminals 501 may be electrically connected through the redistribution patterns 120 to the first lower semiconductor chip 201. Therefore, lengths of electrical paths may be reduced between the first solder terminals 501 and the first lower semiconductor chip 201. As the first thickness T1 is relatively small, the lengths of electrical paths may further be reduced between the first solder terminals 501 and the first lower semiconductor chip 201. The first lower semiconductor chip 201 may achieve an increase in operating speed.

The second solder terminals 502 may be disposed on the bottom surface at the edge region of the lower redistribution substrate 100. In a plan view, the second solder terminals 502 may be spaced apart from the first lower semiconductor chip 201. The second solder terminals 502 may be electrically connected through the lower redistribution substrate 100 to the conductive structures 300. For example, the second solder terminals 502 may be electrically connected to the first upper semiconductor chip 701 through the conductive structures 300 and the upper redistribution substrate 600. At least one of the second solder terminals 502 may vertically overlap the conductive structure 300 electrically connected thereto. Alternatively, in a plan view, one of the second solder terminals 502 may be adjacent to the conductive structure 300 electrically connected thereto. Therefore, lengths of electrical paths may be reduced between the second solder terminals 502 and the first upper semiconductor chip 701. The first upper semiconductor chip 701 may achieve an increase in operating speed. As the first and second thicknesses T1 and T2 are relatively small, the first upper semiconductor chip 701 may achieve a further increase in operating speed.

The conductive structures 300 may serve as electrical paths for the first upper semiconductor chip 701. The conductive structures 300 may have relatively small resistivity. For example, the resistivity of the conductive structures 300 may be less than that of a solder material. The resistivity of the conductive structures 300 may be less than that of the first lower solder patterns 251 and also less than that of the first upper solder patterns 751. Therefore, even though the conductive structures 300 have large height, the conductive structures 300 may accomplish rapid signal transfer therethrough. Accordingly, the first upper semiconductor chip 701 may achieve better electrical properties.

The first upper semiconductor chip 701 may have high performance properties and a relatively large number of input/output terminals. The input/output terminals of the first upper semiconductor chip 701 may be the first upper chip pads 731. According to some example embodiments, a large number of the conductive structures 300 per unit area may be disposed due to their relatively small pitch P1 and width W. For example, the number of the conductive structures 300 may be the same as or greater than that of the first upper chip pads 731. Therefore, even though the number of the first upper chip pads 731 is large, a good electrical connection may be provided between the first upper semiconductor chip 701 and an external apparatus.

The semiconductor package 1 may be a package-on-package, but the present inventive concepts are not necessarily limited thereto.

Figure 2A:
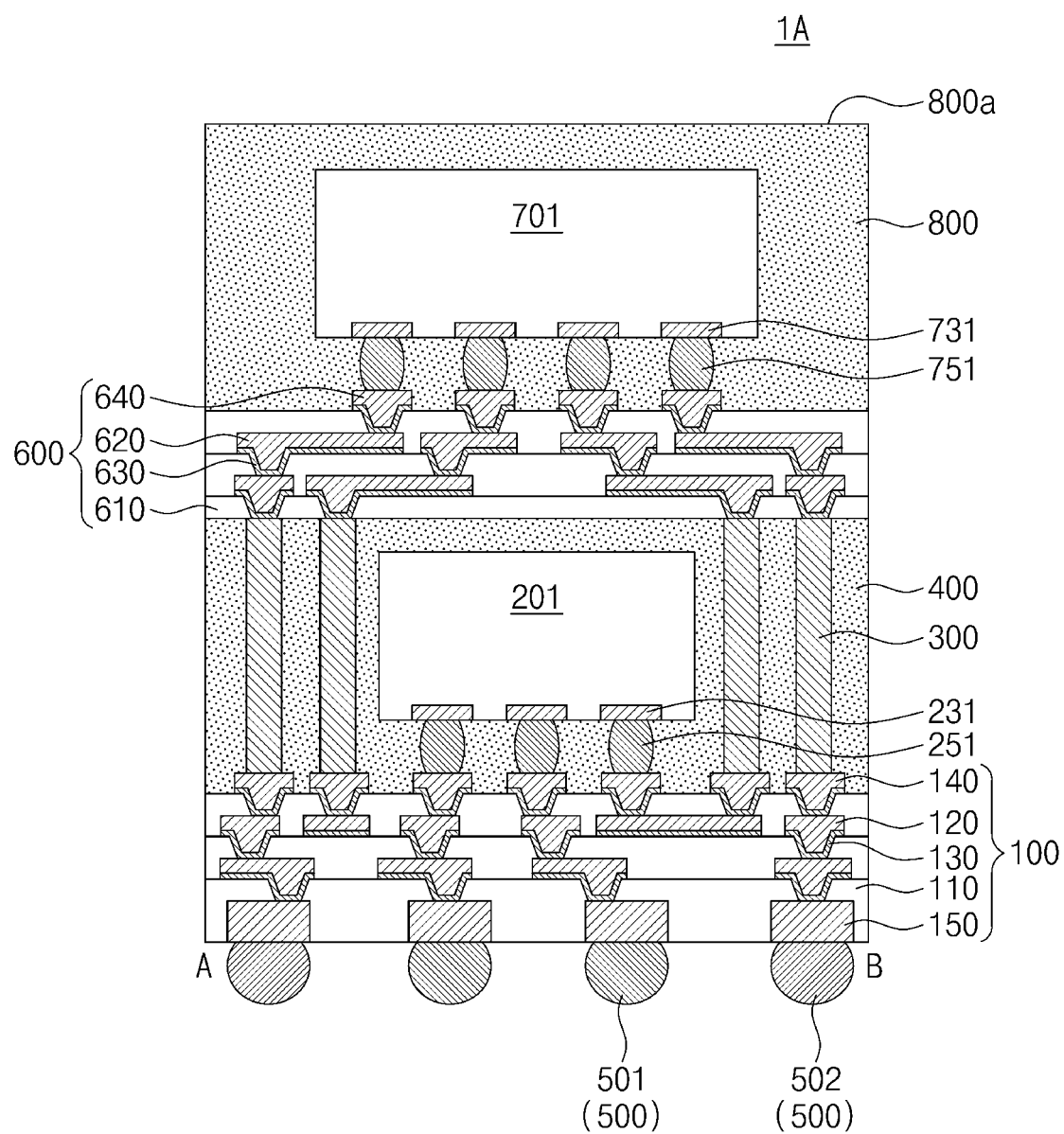
FIG. 2A is a cross-sectional view showing a semiconductor package according to some example embodiments.

FIG. 2A is a cross-sectional view taken along line A-B of FIG. 1A, showing a semiconductor package according to some example embodiments. To the extent that a description of various elements has been omitted, it may be assumed that those elements are at least similar to corresponding elements that have been described elsewhere within the present disclosure.

Referring to FIG. 2A, a semiconductor package 1A may include a lower redistribution substrate 100, solder terminals 500, a first lower semiconductor chip 201, first lower solder patterns 251, a lower molding layer 400, conductive structures 300, an upper redistribution substrate 600, a first upper semiconductor chip 701, first upper solder patterns 751, and an upper molding layer 800.

The upper molding layer 800 may cover a top surface of the first upper semiconductor chip 701. The upper molding layer 800 may have a top surface 800a at a higher level than that of the top surface of the first upper semiconductor chip 701.

Figure 2B:
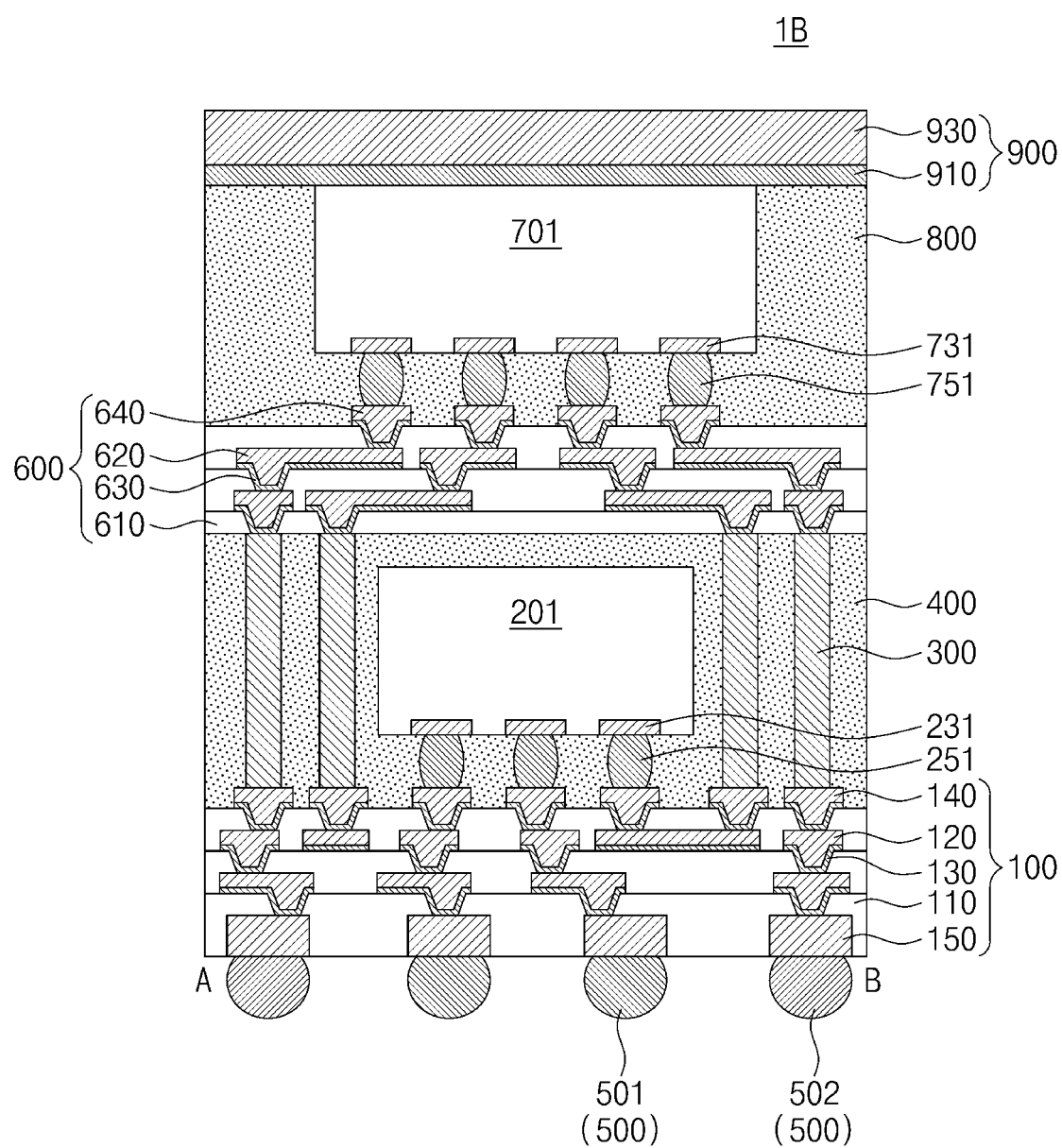
FIG. 2B is a cross-sectional view showing a semiconductor package according to some example embodiments.

FIG. 2B is a cross-sectional view taken along line A-B of FIG. 1A, showing a semiconductor package according to some example embodiments.

Referring to FIG. 2B, a semiconductor package 1B may include a lower redistribution substrate 100, solder terminals 500, a first lower semiconductor chip 201, first lower solder patterns 251, a lower molding layer 400, conductive structures 300, an upper redistribution substrate 600, a first upper semiconductor chip 701, first upper solder patterns 751, and an upper molding layer 800, and may further include a thermal radiation structure 900. The upper molding layer 800 may expose a top surface of the first upper semiconductor chip 701.

The thermal radiation structure 900 may be disposed on the first upper semiconductor chip 701 and the upper molding layer 800. The thermal radiation structure 900 may include one or both of a heat transfer layer 910 and a thermal radiation plate 930. The thermal radiation plate 930 may include a heat slug or a heat sink. The thermal radiation plate 930 may have thermal conductivity greater than that of the upper molding layer 800. The thermal radiation plate 930 may include, for example, metal. The heat transfer layer 910 may be interposed between the first upper semiconductor chip 701 and the thermal radiation plate 930. The heat transfer layer 910 may be in direct physical contact with the top surface of the first upper semiconductor chip 701. The heat transfer layer 910 may extend between the upper molding layer 800 and the thermal radiation plate 930. The heat transfer layer 910 may include a thermal interface material (TIM). As the thermal radiation structure 900 is provided, the first upper semiconductor chip 701 may achieve greater thermal radiation.

Figure 3A:
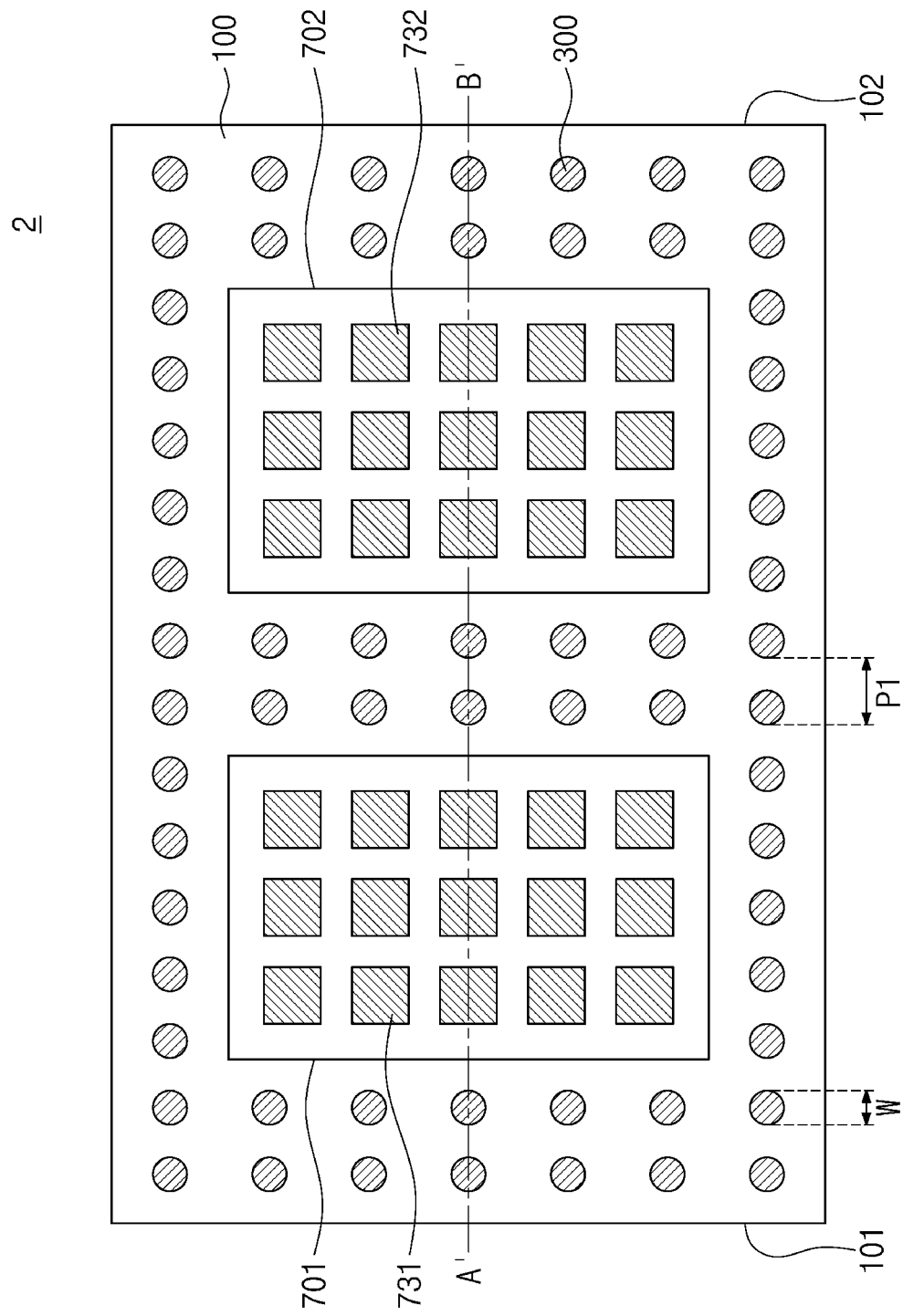
FIG. 3A is a plan view showing a semiconductor package according to some example embodiments.
Figure 3B:
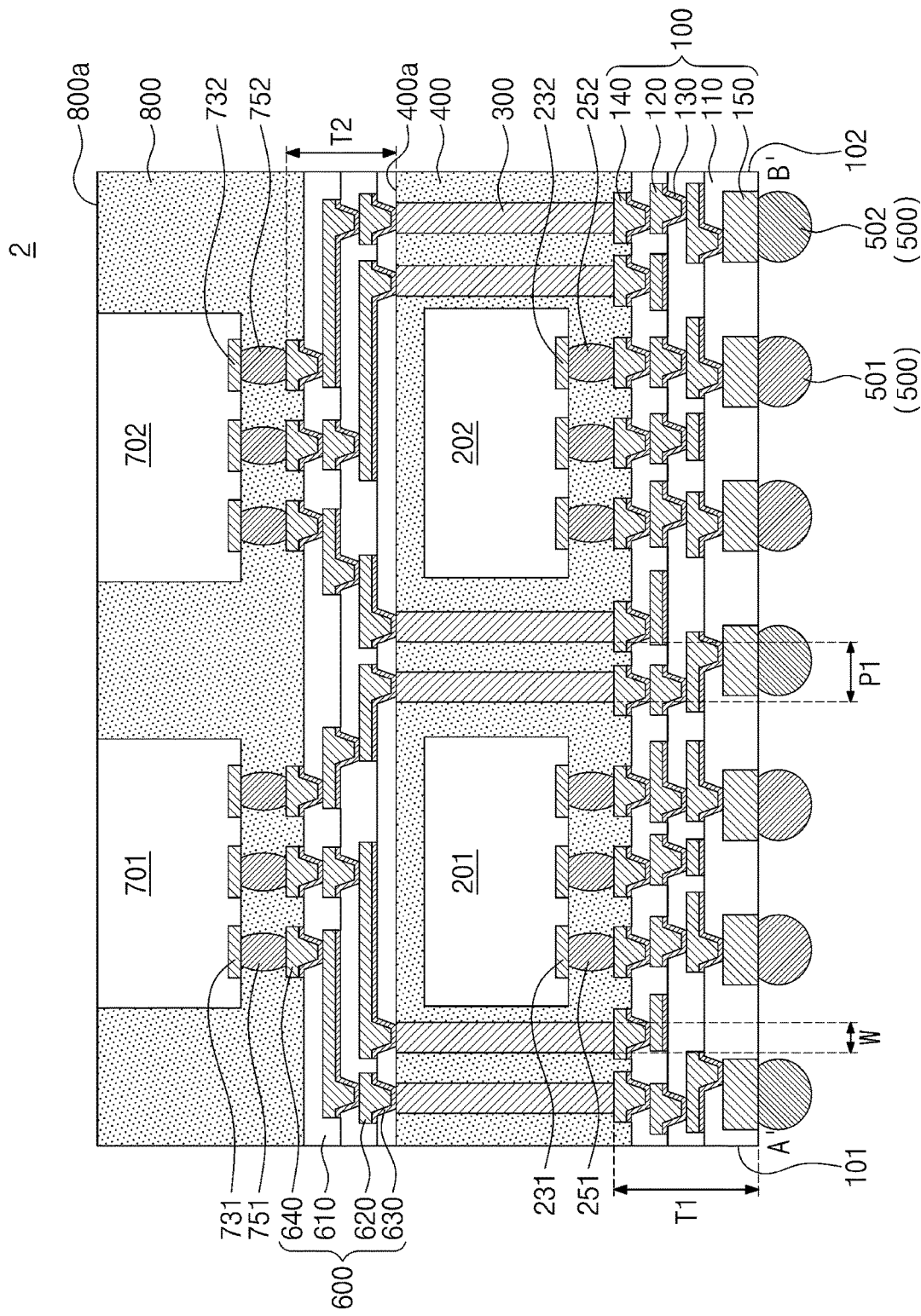
FIG. 3B is a cross-sectional view taken along line A'-B' of FIG. 3A.

FIG. 3A is a plan view showing a semiconductor package according to some example embodiments. FIG. 3B is a cross-sectional view taken along line A'-B' of FIG. 3A. To the extent that a description of various elements has been omitted, it may be assumed that those elements are at least similar to corresponding elements that have been described elsewhere within the present disclosure.

Referring to FIGS. 3A and 3B, a semiconductor package 2 may include a lower redistribution substrate 100, solder terminals 500, a first lower semiconductor chip 201, a second lower semiconductor chip 202, first lower solder patterns 251, second lower solder patterns 252, a lower molding layer 400, conductive structures 300, an upper redistribution substrate 600, a first upper semiconductor chip 701, a second upper semiconductor chip 702, first upper solder patterns 751, second upper solder patterns 752, and an upper molding layer 800. The lower redistribution substrate 100 may have a first outer lateral surface 101 and a second outer lateral surface 102 that are opposite to each other. In a plan view, the first lower semiconductor chip 201 may be disposed adjacent to the first outer lateral surface 101 of the lower redistribution substrate 100. For example, an interval between the first lower semiconductor chip 201 and the first outer lateral surface 101 of the lower redistribution substrate 100 may be less than that between the first lower semiconductor chip 201 and the second outer lateral surface 102 of the lower redistribution substrate 100.

The second lower semiconductor chip 202 may be provided on a top surface of the lower redistribution substrate 100. The second lower semiconductor chip 202 may be laterally spaced apart from the first lower semiconductor chip 201. In a plan view, the second lower semiconductor chip 202 may be disposed between the first lower semiconductor chip 201 and the second outer lateral surface of the lower redistribution substrate 100. The second lower semiconductor chip 202 may have top and bottom surfaces that are opposite to each other. The bottom surface of the second lower semiconductor chip 202 may be an active surface, and the top surface of the second lower semiconductor chip 202 may be an inactive surface. For example, the second lower semiconductor chip 202 may include second lower chip pads 232 disposed on the bottom surface thereof. The second lower semiconductor chip 202 may further include a semiconductor substrate, integrated circuits, and a wiring layer. The semiconductor substrate, the integrated circuits, and the wiring layer of the second lower semiconductor chip 202 may respectively be the same as or similar to the lower semiconductor substrate 210, the lower integrated circuits 215, and the lower wiring layer of the first lower semiconductor chip 201 depicted in FIG. 1C.

The second lower solder patterns 252 may be interposed between the lower redistribution substrate 100 and the second lower semiconductor chip 202. The second lower solder patterns 252 may be interposed between, may correspond to, and may be coupled to the redistribution pads 140 and the second lower chip pads 232. Therefore, the second lower semiconductor chip 202 may be coupled through the second lower solder patterns 252 to the lower redistribution substrate 100. The number of the second lower solder patterns 252 may be the same as the number of the second lower chip pads 232, but the present inventive concepts are not necessarily limited thereto. Each of the second lower solder patterns 252 may have a solder ball shape and may include a solder material. The second lower solder patterns 252 may have a relatively high thermal conductivity. For example, the thermal conductivity of the second lower solder patterns 252 may be greater than that of the lower molding layer 400. When the semiconductor package 2 operates, heat generated from the second lower semiconductor chip 202 may be promptly discharged to the outside through the second lower solder patterns 252, the redistribution pads 140, and the redistribution patterns 120. As the first thickness T1 is relatively small, the second lower semiconductor chip 202 may achieve greater thermal radiation.

The lower molding layer 400 may be disposed substantially the same as that discussed in the example of FIG. 1B. In addition, the lower molding layer 400 may cover the top surface and a sidewall of the second lower semiconductor chip 202. The lower molding layer 400 may have a top surface 400a at a higher level than that of the top surface of the second lower semiconductor chip 202. The lower molding layer 400 may be provided in a gap between the lower redistribution substrate 100 and the second lower semiconductor chip 202, and may cover the bottom surface of the second lower semiconductor chip 202 and sidewalls of the second lower solder patterns 252. Therefore, it might not be necessary to separately form an under-fill layer between the lower redistribution substrate 100 and the second lower semiconductor chip 202, and accordingly it may be possible to fabricate the semiconductor package 2 more simply.

The second upper semiconductor chip 702 may be disposed on a top surface of the upper redistribution substrate 600 and may be laterally spaced apart from the first upper semiconductor chip 701. The second upper semiconductor chip 702 may have a bottom surface as an active surface, and may also have a top surface as an inactive surface. For example, the second upper semiconductor chip 702 may include second upper chip pads 732 provided on the bottom surface thereof. The second upper semiconductor chip 702 may further include a semiconductor substrate, integrated circuits, and a wiring layer. The semiconductor substrate, the integrated circuits, and the wiring layer of the second upper semiconductor chip 702 may respectively be the same as or similar to the upper semiconductor substrate 710, the upper integrated circuits 715, and the upper wiring layer of the first upper semiconductor chip 701 depicted in FIG. 1D.

The second upper solder patterns 752 may be interposed between the upper redistribution substrate 600 and the second upper semiconductor chip 702. The second upper solder patterns 752 may be interposed between, may correspond to, and may be coupled to the upper redistribution pads 640 and the second upper chip pads 732. Therefore, the second upper semiconductor chip 702 may be coupled through the second upper solder patterns 752 to the upper redistribution substrate 600. Each of the second upper solder patterns 752 may have a solder ball shape and may include a solder material. The number of the second upper solder patterns 752 may be the same as the number of the second upper chip pads 732, but the present inventive concepts are not necessarily limited thereto.

For example, the first lower semiconductor chip 201 may be of the same type as the second lower semiconductor chip 202, the first upper semiconductor chip 701, and the second upper semiconductor chip 702. The first lower semiconductor chip 201, the second lower semiconductor chip 202, the first upper semiconductor chip 701, and the second upper semiconductor chip 702 may be memory chips, such as GDDR SDRAM. In this case, the first lower semiconductor chip 201 may have the same size and storage capacity as those of the second lower semiconductor chip 202, the first upper semiconductor chip 701, and the second upper semiconductor chip 702. The number of the first lower chip pads 231 may be the same as that of the second lower chip pads 232, that of the first upper chip pads 731, that of the first upper chip pads 731, and that of the second upper chip pads 732. Alternatively, the first lower semiconductor chip 201 may be of a different type from at least one selected from the second lower semiconductor chip 202, the first upper semiconductor chip 701, and the second upper semiconductor chip 702. In this case, the first lower semiconductor chip 201 may have a different size from that of at least one of the lower semiconductor chip 202, the first upper semiconductor chip 701, or the second upper semiconductor chip 702. The number of the first lower chip pads 231 may be different from that of the second lower chip pads 232, that of the first upper chip pads 731, or that of the second upper chip pads 732.

The upper redistribution substrate 600 may be provided on its top surface with the upper molding layer 800 that covers a sidewall of the first upper semiconductor chip 701 and a sidewall of the second upper semiconductor chip 702. The upper molding layer 800 might not cover any of top surfaces of the first and second upper semiconductor chips 701 and 702. The upper molding layer 800 may have a top surface 800a at substantially the same level as that of the top surface of the first upper semiconductor chip 701 and that of the top surface of the second upper semiconductor chip 702. Therefore, the first and second upper semiconductor chips 701 and 702 may achieve greater thermal radiation. The upper molding layer 800 may extend into a gap between the upper redistribution substrate 600 and the second upper semiconductor chip 702, and may cover the bottom surface of the second upper semiconductor chip 702 and sidewalls of the second upper solder patterns 752. Therefore, it might not be necessary to separately form an under-fill layer between the upper redistribution substrate 600 and the second upper semiconductor chip 702, and accordingly it may be possible to fabricate the semiconductor package 2 more simply.

The conductive structures 300 may be provided between and electrically connected to the lower redistribution substrate 100 and the upper redistribution substrate 600. The conductive structures 300 may be laterally spaced apart from the first lower semiconductor chip 201 and the second lower semiconductor chip 202. The conductive structures 300 may have top surfaces at a higher level than that of the top surface of the second lower semiconductor chip 202.

The number of the conductive structures 300 may be the same as or greater than a sum of the number of the first upper chip pads 731 and the number of the second upper chip pads 732. The number of the conductive structures 300 may be the same as or greater than a sum of the number of the first upper solder patterns 751 and the number of the second upper solder patterns 752. For example, the number of the conductive structures 300 may be the same as or greater than a sum of the number of the first lower chip pads 231 and the number of the second lower chip pads 232. The number of the conductive structures 300 may be the same as or greater than a sum of the number of the first lower solder patterns 251 and the number of the second lower solder patterns 252. A large number of the conductive structures 300 per unit area may be disposed, and the semiconductor package 2 may decrease in size.

In a plan view, the lower redistribution substrate 100 may have a first region, a second region, and a third region. The first region of the lower redistribution substrate 100 may be provided between the first lower semiconductor chip 201 and the first outer lateral surface 101 of the lower redistribution substrate 100. The second region of the lower redistribution substrate 100 may be provided between the second lower semiconductor chip 202 and the second outer lateral surface 102 of the lower redistribution substrate 100. The third region of the lower redistribution substrate 100 may be provided between the first lower semiconductor chip 201 and the second lower semiconductor chip 202. In a plan view, the conductive structures 300 may be provided on the first, second, and third regions of the lower redistribution substrate 100.

The solder terminals 500 may include first solder terminals 501 and second solder terminals 502. One of the first solder terminals 501 may vertically overlap and have electrical connection with the first lower semiconductor chip 201. Another of the first solder terminals 501 may vertically overlap and have electrical connection with the second lower semiconductor chip 202. Therefore, lengths of electrical connections may be reduced between the first solder terminals 501 and the first and second lower semiconductor chips 201 and 202. The first and second lower semiconductor chips 201 and 202 may achieve an increase in operating speed.

In a plan view, the second solder terminals 502 may be spaced apart from the first lower semiconductor chip 201 and the second lower semiconductor chip 202. In a plan view, the second solder terminals 502 may be provided on the first, second, or third region of the lower redistribution substrate 100. The second solder terminals 502 may be electrically connected through the redistribution patterns 120 and the conductive structures 300 to the first upper semiconductor chip 701 or the second upper semiconductor chip 702. The lower redistribution substrate 100 may have, on a bottom surface at the first region, the second solder terminals 502 electrically connected to the conductive structures 300 on a top surface at the first region of the lower redistribution substrate 100. The lower redistribution substrate 100 may have, on a bottom surface at the second region, the second solder terminals 502 electrically connected to the conductive structures 300 on a top surface at the second region of the lower redistribution substrate 100. The lower redistribution substrate 100 may have, on a bottom surface at the third region, the second solder terminals 502 electrically connected to the conductive structures 300 on a top surface at the third region of the lower redistribution substrate 100. Therefore, lengths of electrical connections may be reduced between the first upper semiconductor chip 701 and the first solder terminals 501 and between the second upper semiconductor chip 702 and the second solder terminals 502. The first and second upper semiconductor chips 701 and 702 may achieve a further increase in operating speed.

The conductive structures 300 may have resistivity that is less than that of the first lower solder patterns 251, that of the second lower solder patterns 252, that of the first upper solder patterns 751, and that of the second upper solder patterns 752. Therefore, the first and second upper semiconductor chips 701 and 702 may achieve an increase in operating speed.

FIG. 4A is a cross-sectional view taken along line A'-B' of FIG. 1A, showing a semiconductor package according to some example embodiments. To the extent that a description of various elements has been omitted, it may be assumed that those elements are at least similar to corresponding elements that have been described elsewhere within the present disclosure.

Referring to FIG. 4A, a semiconductor package 2A may include a lower redistribution substrate 100, solder terminals 500, a first lower semiconductor chip 201, a second lower semiconductor chip 202, first lower solder patterns 251, second lower solder patterns 252, a lower molding layer 400, conductive structures 300, an upper redistribution substrate 600, a first upper semiconductor chip 701, a second upper semiconductor chip 702, first upper solder patterns 751, second upper solder patterns 752, and an upper molding layer 800.

The upper molding layer 800 may cover a top surface of the first upper semiconductor chip 701 and a top surface of the second upper semiconductor chip 702. The upper molding layer 800 may have a top surface 800a at a higher level than that of the top surface of the first upper semiconductor chip 701 and that of the top surface of the second upper semiconductor chip 702.

Figure 4B:
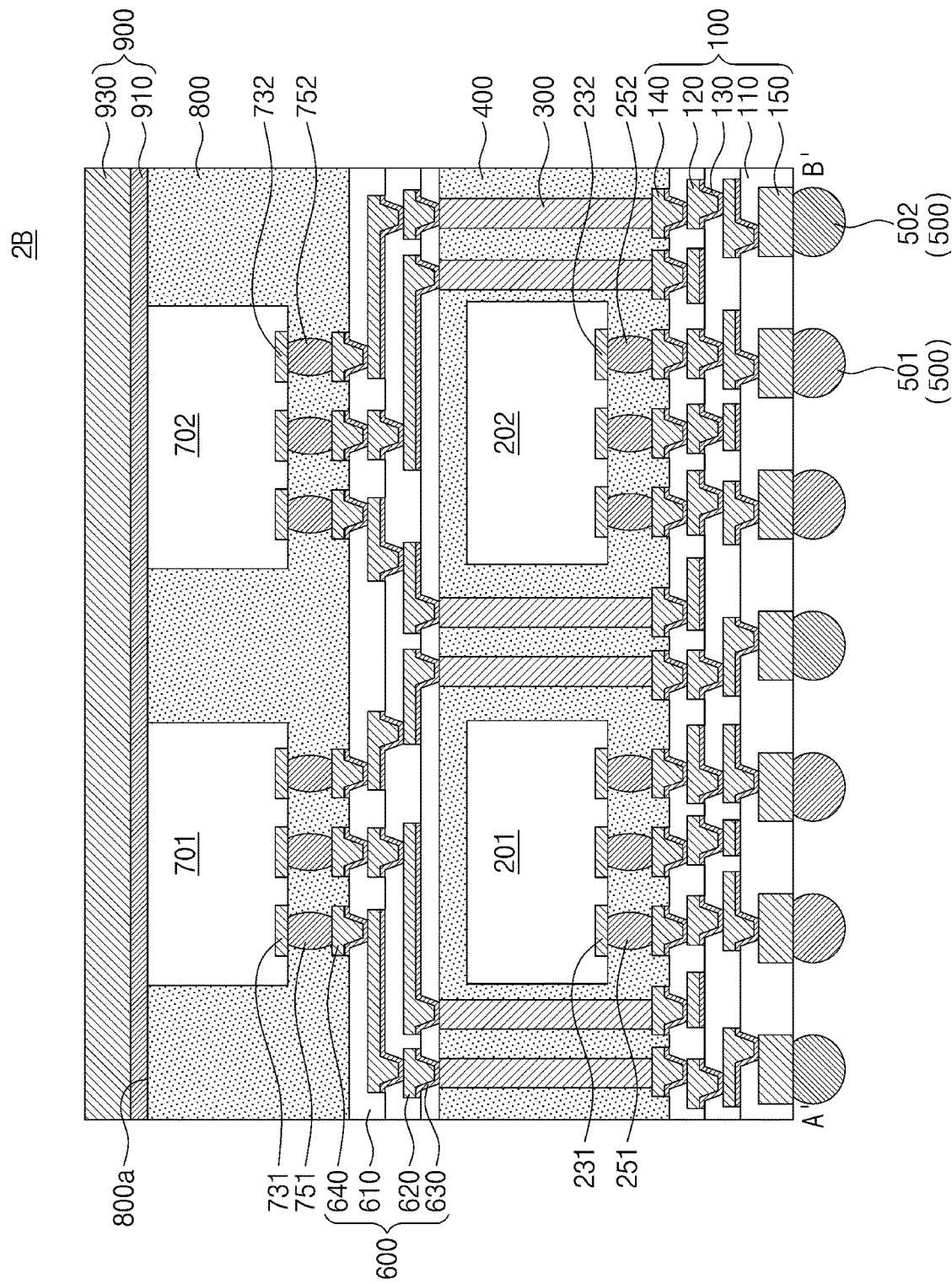
FIG. 4B is a cross-sectional view showing a semiconductor package according to some example embodiments.

FIG. 4B is a cross-sectional view taken along line A'-B' of FIG. 1A, showing a semiconductor package according to some example embodiments.

Referring to FIG. 4B, a semiconductor package 2B may include a lower redistribution substrate 100, solder terminals 500, a first lower semiconductor chip 201, a second lower semiconductor chip 202, first lower solder patterns 251, second lower solder patterns 252, a lower molding layer 400, conductive structures 300, an upper redistribution substrate 600, a first upper semiconductor chip 701, a second upper semiconductor chip 702, first upper solder patterns 751, second upper solder patterns 752, an upper molding layer 800, and a thermal radiation structure 900. The upper molding layer 800 may expose a top surface of the first upper semiconductor chip 701 and a top surface of the second upper semiconductor chip 702.

The thermal radiation structure 900 may be disposed on the top surface of the first upper semiconductor chip 701, the top surface of the second upper semiconductor chip 702, and a top surface 800a of the upper molding layer 800. The thermal radiation structure 900 may include one or both of a heat transfer layer 910 and a thermal radiation plate 930. The heat transfer layer 910 may be interposed between the first upper semiconductor chip 701 and the thermal radiation plate 930, between the second upper semiconductor chip 702 and the thermal radiation plate 930, and between the upper molding layer 800 and the thermal radiation plate 930. The heat transfer layer 910 may be in direct physical contact with the top surface of the first upper semiconductor chip 701 and the top surface of the second upper semiconductor chip 702.

FIGS. 5A to 5I are cross-sectional views taken along line A-B of FIG. 1A, showing a method of fabricating a semiconductor package according to some example embodiments.

Figure 5A:
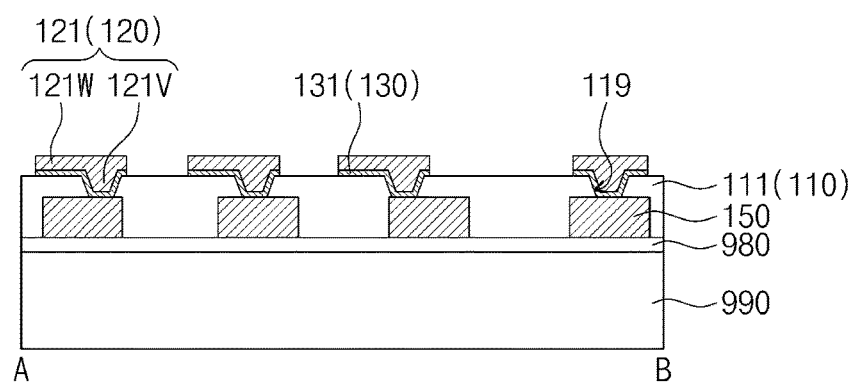
FIGS. 5A to 5I are cross-sectional views showing a method of fabricating a semiconductor package according to some example embodiments.

Referring to FIG. 5A, under-bump patterns 150, a first lower dielectric layer 111, first seed patterns 131, and first redistribution patterns 121 may be formed on a carrier substrate 990. A carrier adhesive layer 980 may further be formed between the carrier substrate 990 and the first lower dielectric layer 111 and between the carrier substrate 990 and the under-bump patterns 150. The carrier adhesive layer 980 may attach the first lower dielectric layer 111 and the under-bump patterns 150 to the carrier substrate 990. The carrier adhesive layer 980 may be a release layer.

According to some example embodiments, the under-bump patterns 150 may be formed on the carrier adhesive layer 980. The first lower dielectric layer 111 may be formed on the carrier adhesive layer 980 and may cover sidewalls and top surfaces of the under-bump patterns 150. First openings 119 may be formed in the first lower dielectric layer 111 and may expose the under-bump patterns 150.

The formation of the first seed patterns 131 and the first redistribution patterns 121 may include forming a first seed layer in the first openings 119 and on a top surface of the first lower dielectric layer 111, forming on the first seed layer a resist pattern having guide openings, performing an electroplating process in which the first seed layer is used as an electrode, removing the resist pattern and exposing a portion of the first seed layer, and etching the exposed portion of the first seed layer.

The guide openings may be correspondingly connected to the first openings 119. The electroplating process may form the first redistribution patterns 121 in the first openings 119 and the guide openings. Each of the first redistribution patterns 121 may include a first via portion 121V and a first wire portion 121W. The first via portion 121V may be formed in a corresponding first opening 119, and the first wire portion 121W may be formed in a lower portion of a corresponding guide opening. The etching of the first seed layer may form the first seed patterns 131 below, and in correspondence with, first redistribution patterns 121.

Figure 5B:
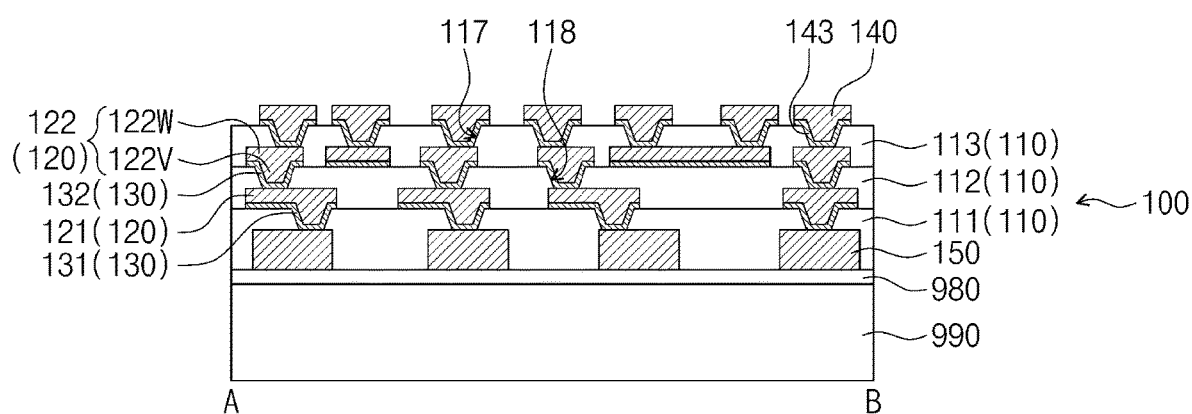

Referring to FIG. 5B, a second lower dielectric layer 112 may be formed on the first lower dielectric layer 111 and may cover the first redistribution patterns 121. Second openings 118 may be formed in the second lower dielectric layer 112 to expose the first redistribution patterns 121. Second redistribution patterns 122 may be formed in the second openings 118 and may be coupled to the first redistribution patterns 121. Each of the second redistribution patterns 122 may include a second via portion 122V and a second wire portion 122W. The second via portion 122V may be provided in a corresponding second opening 118. The second wire portion 122W may be formed on the second via portion 122V to extend onto a top surface of the second lower dielectric layer 112.

Second seed patterns 132 may be formed below, and may correspond to, the second redistribution patterns 122. The formation of the second seed patterns 132 and the second redistribution patterns 122 may be formed by performing a method substantially the same as that used for forming the first seed patterns 131 and the first redistribution patterns 121 of FIG. 5A. For example, an electroplating process may be performed in which the second seed patterns 132 are used as electrodes to form the second redistribution patterns 122.

A third lower dielectric layer 113 may be formed on the second lower dielectric layer 112 and may cover the second redistribution patterns 122. Third openings 117 may be formed in the third lower dielectric layer 113 and may expose the second redistribution patterns 122. Redistribution pads 140 may be formed in, and correspond to, the third openings 117 and may be coupled to the second redistribution patterns 122. Seed pads 143 may be formed below, and may correspond to, the redistribution pads 140. According to some example embodiments, an electroplating process may be performed in which the seed pads 143 are used as electrodes to form the redistribution pads 140. Therefore, a lower redistribution substrate 100 may be fabricated. The lower redistribution substrate 100 may include the first, second, and third lower dielectric layers 111, 112, and 113, the first seed patterns 131, the first redistribution patterns 121, the second seed patterns 132, the second redistribution patterns 122, the seed pads 143, and the redistribution pads 140.

Figure 5C:
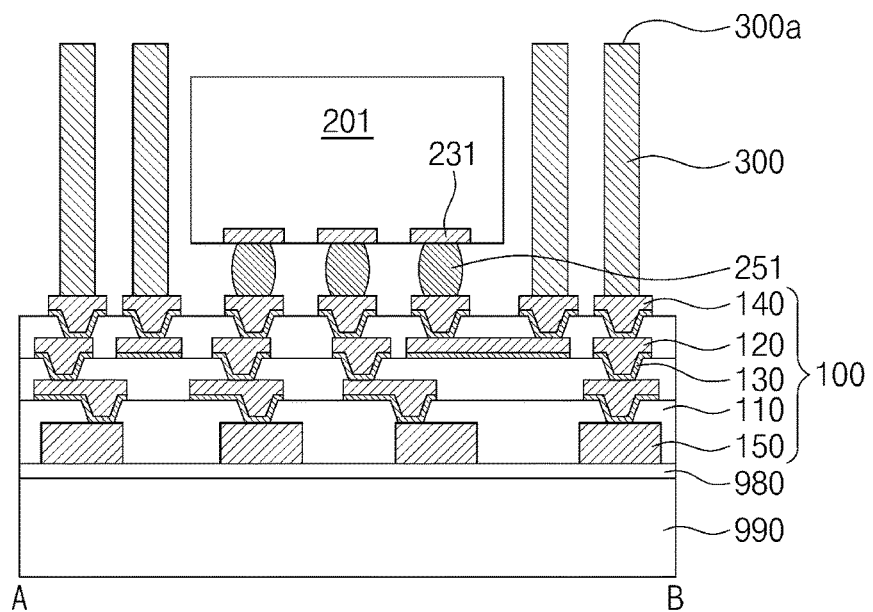

Referring to FIG. 5C, a first lower semiconductor chip 201 may be mounted on a top surface of the lower redistribution substrate 100. The mounting of the first lower semiconductor chip 201 may include forming first lower solder patterns 251 between first lower chip pads 231 and corresponding redistribution pads 140.

Conductive structures 300 may be formed on the top surface at an edge region of the lower redistribution substrate 100 and may be coupled to corresponding redistribution pads 140. The formation of the conductive structures 300 may include providing metal pillars on corresponding redistribution pads 140. In this case, the conductive structures 300 may have top surfaces 300a at a higher level than that of a top surface of the first lower semiconductor chip 201. The formation of the conductive structures 300 may be performed before or after the mounting of the first lower semiconductor chip 201.

Figure 5D:
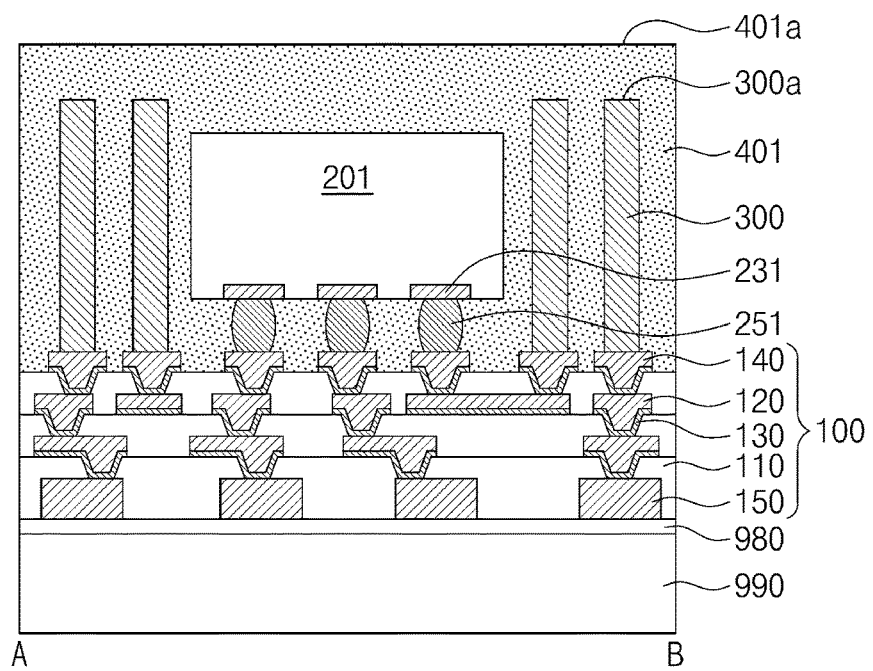

Referring to FIG. 5D, a preliminary lower molding layer 401 may be formed on the top surface of the lower redistribution substrate 100 and may cover the first lower semiconductor chip 201 and the conductive structures 300. For example, the preliminary lower molding layer 401 may have a top surface 401a at a higher level than that of the top surface of the first lower semiconductor chip 201 and top surfaces 300a of the conductive structures 300. The preliminary lower molding layer 401 may extend onto a bottom surface of the first lower semiconductor chip 201 and may encapsulate the first lower solder patterns 251.

Figure 5E:
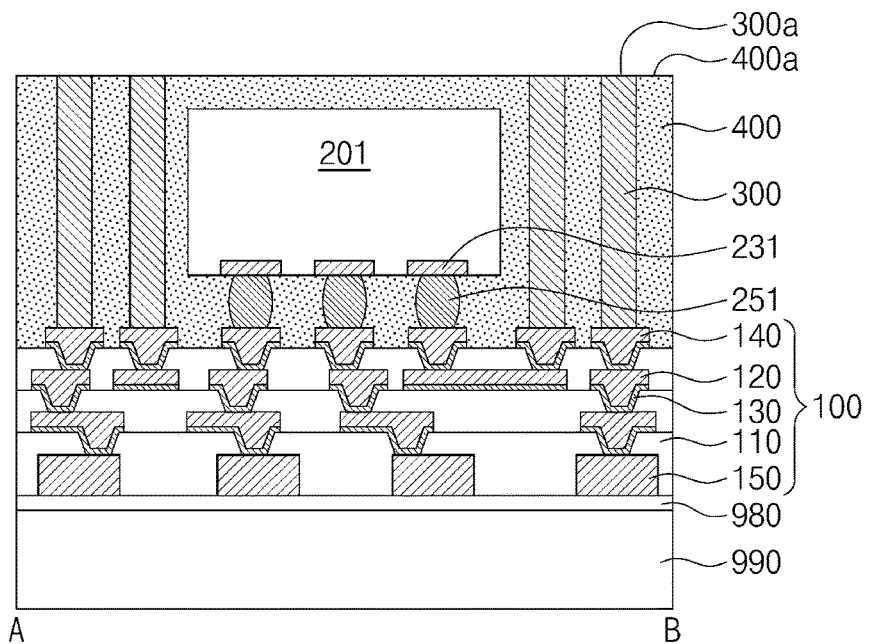

Referring to FIG. 5E, the preliminary lower molding layer 401 may undergo a grinding process to form a lower molding layer 400. For example, the grinding process may include a chemical mechanical polishing (CMP) process. The grinding process may continue until the top surfaces 300a of the conductive structures 300 are exposed.

When the grinding process is further performed on the first lower semiconductor chip 201, grinding residues may be generated from the first lower semiconductor chip 201. The residues may migrate onto and contaminate the top surfaces 300a of the conductive structures 300. According to some example embodiments, the grinding process may stop before the top surface of the first lower semiconductor chip 201 is exposed. Therefore, the conductive structures 300 may be prevented from contamination.

As a result of the grinding process, a top surface 400a of the lower molding layer 400 may be located at a higher level than that of the top surface of the first lower semiconductor chip 201 and may cover the top surface of the first lower semiconductor chip 201. The top surface 400a of the lower molding layer 400 may be coplanar with the top surfaces 300a of the conductive structures 300.

Figure 5F:
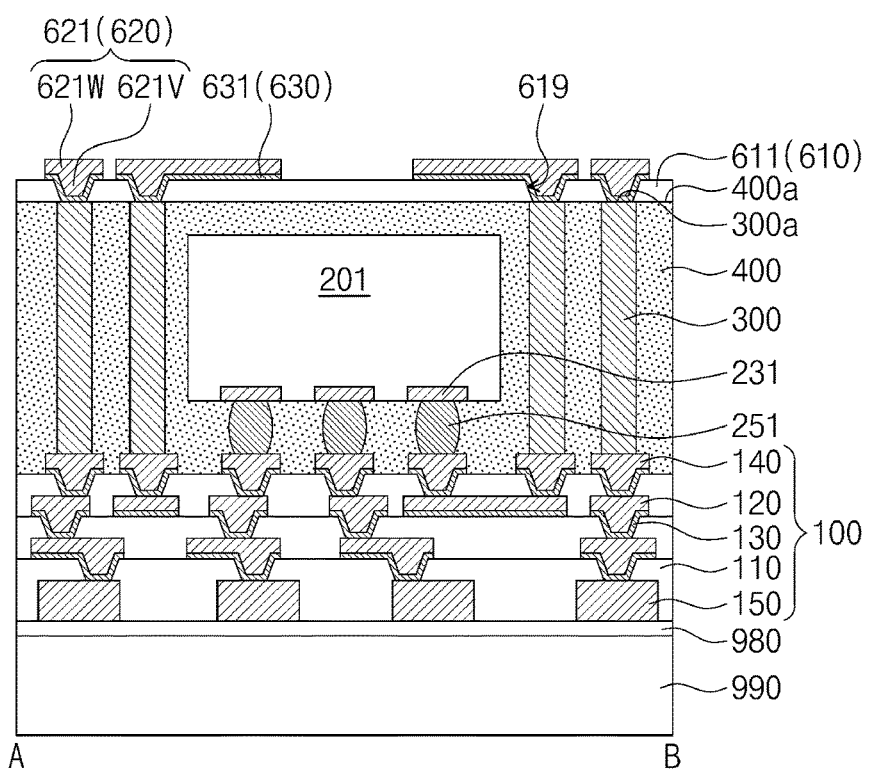

Referring to FIG. 5F, a first upper dielectric layer 611 may be formed on the top surface 400a of the lower molding layer 400. First upper openings 619 may be formed in the first upper dielectric layer 611 to expose the corresponding top surfaces 300a of the conductive structures 300. First upper redistribution layers 621 may be formed in the first upper openings 619 and on a top surface of the first upper dielectric layer 611. Each of the first upper redistribution layers 621 may include a first via pattern 621V and a first wire pattern 621W. The first via pattern 621V may be formed in a corresponding first upper opening 619. The first wire pattern 621W may be formed on the first via pattern 621V and may extend onto the top surface of the first upper dielectric layer 611. First upper seed patterns 631 may be formed on bottom surfaces of the first upper redistribution layers 621. The formation of the first upper redistribution layers 621 and the first upper seed patterns 631 may be the same as or similar to that used for forming the first redistribution patterns 121 and the first seed patterns 131 of FIG. 5A.

Figure 5G:
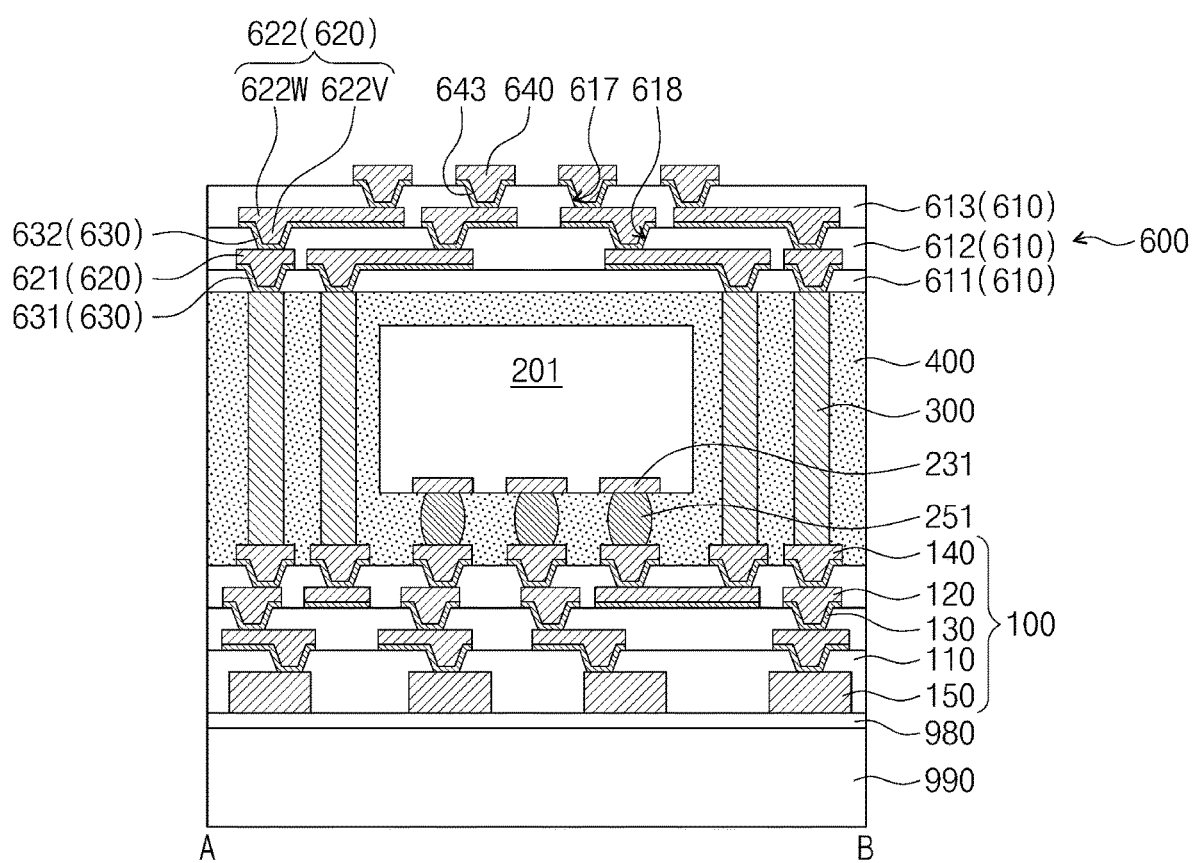

Referring to FIG. 5G, a second upper dielectric layer 612 may be formed on the first upper dielectric layer 611 and may cover the first upper redistribution layers 621. Second upper openings 618 may be formed in the second upper dielectric layer 612 to expose the first upper redistribution layers 621. Second upper redistribution layers 622 may be formed in, and correspond to, the second upper openings 618 and may be coupled to the first upper redistribution layers 621. Each of the second upper redistribution layers 622 may include a second via pattern 622V and a second wire pattern 622W. The second via pattern 622V may be formed in a corresponding second upper opening 618. The second wire pattern 622W may be formed on the second via pattern 622V and may extend onto a top surface of the second upper dielectric layer 612. Second upper seed patterns 632 may be formed below, and may correspond to, the second upper redistribution layers 622. According to some example embodiments, an electroplating process may be performed in which the second upper seed patterns 632 are used as electrodes to form the second upper redistribution layers 622.

A third upper dielectric layer 613 may be formed on the second upper dielectric layer 612 and may cover the second redistribution layers 622. Third upper openings 617 may be formed in the third upper dielectric layer 613 and may expose the second upper redistribution layers 622. Upper redistribution pads 640 may be formed in, and may correspond to, the third upper openings 617 and may be coupled to the second upper redistribution layers 622. Upper seed pads 643 may be formed below, and may correspond to, the upper redistribution pads 640. The upper redistribution pads 640 may be formed by an electroplating process in which the upper seed pads 643 are used as electrodes. Accordingly, an upper redistribution substrate 600 may be fabricated. The upper redistribution substrate 600 may include the first, second, and third upper dielectric layers 611, 612, and 613, the first upper seed patterns 631, the first upper redistribution layers 621, the second upper seed patterns 632, the second upper redistribution layers 622, upper seed pads 643, and the upper redistribution pads 640.

Figure 5H:
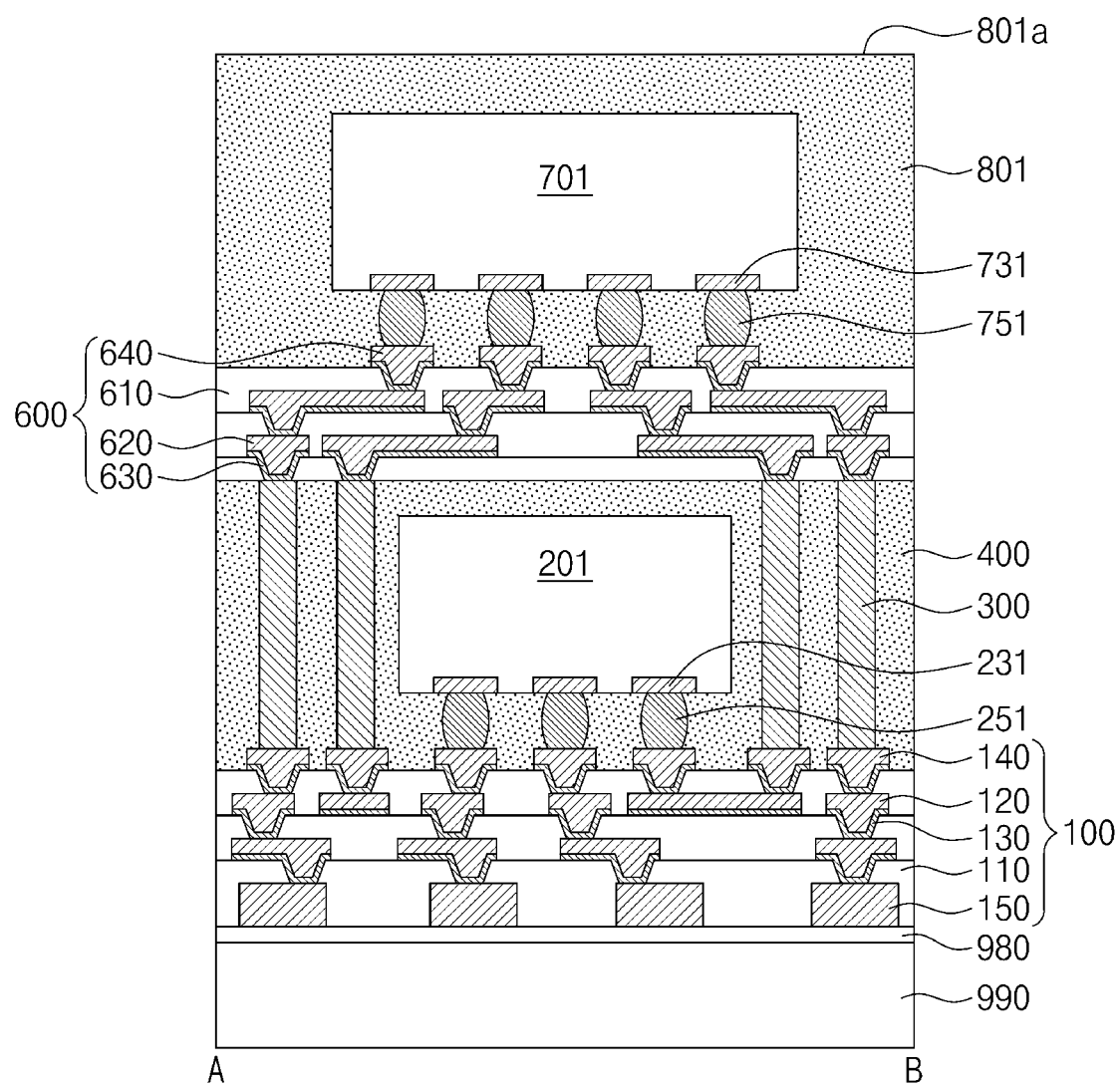

Referring to FIG. 5H, a first upper semiconductor chip 701 may be mounted on a top surface of the upper redistribution substrate 600. The mounting of the first upper semiconductor chip 701 may include forming first upper solder patterns 751 between first upper chip pads 731 and corresponding upper redistribution pads 640.

A preliminary upper molding layer 801 may be formed on the top surface of the upper redistribution substrate 600 and may cover the first upper semiconductor chip 701. For example, the preliminary upper molding layer 801 may have a top surface 801a at a higher level than that of a top surface of the first upper semiconductor chip 701 and may cover the top surface of the first upper semiconductor chip 701. The preliminary upper molding layer 801 may extend onto a bottom surface of the first upper semiconductor chip 701 and may encapsulate the first upper solder patterns 751.

Figure 5I:
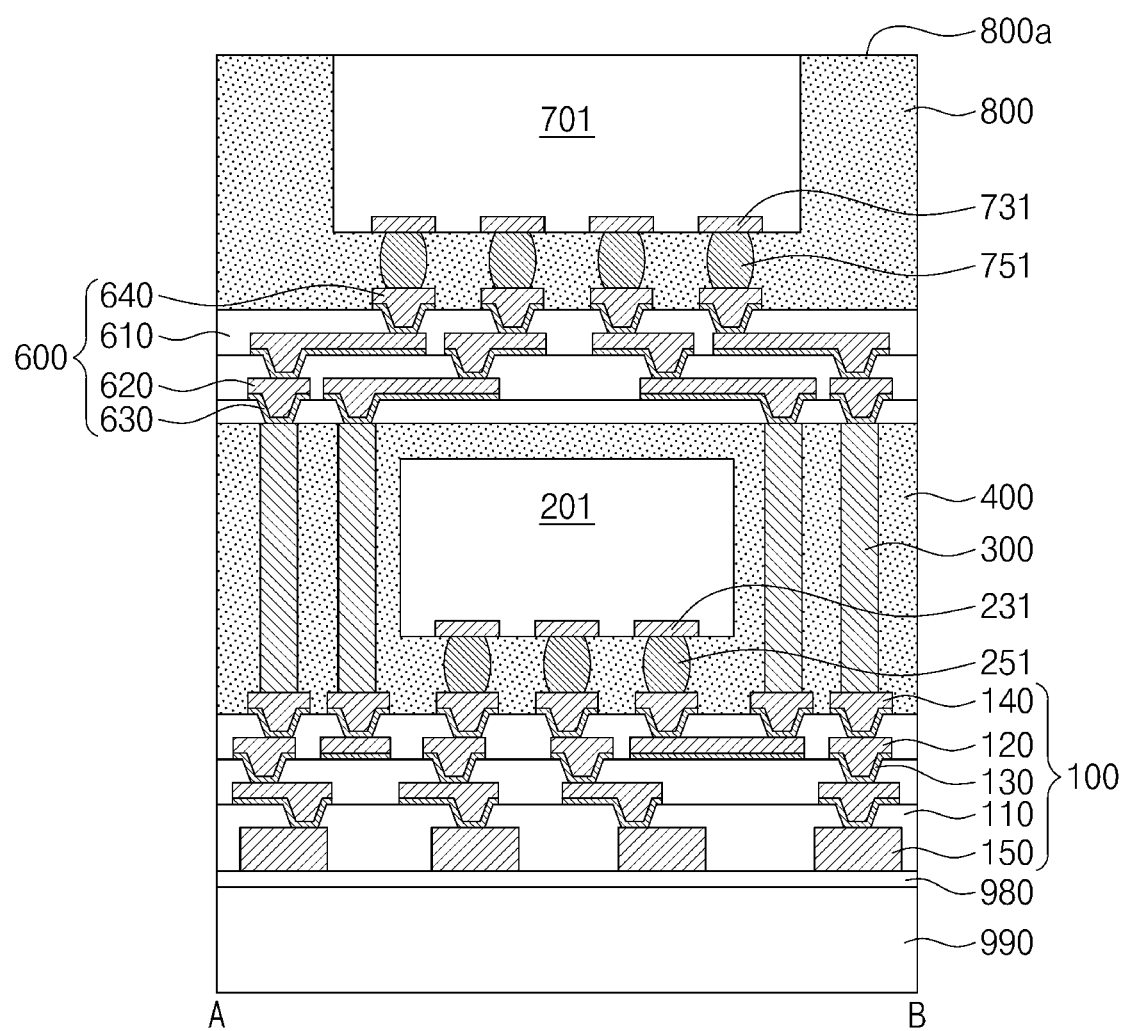

Referring to FIG. 5I, the preliminary upper molding layer 801 may undergo a grinding process to form an upper molding layer 800. For example, the grinding process may include a chemical mechanical polishing (CMP) process. The grinding process may continue until the first upper semiconductor chip 701 is exposed. As a result of the grinding process, the upper molding layer 800 may have a top surface 800a that is coplanar with the top surface of the first upper semiconductor chip 701.

Referring back to FIG. 1B, the carrier substrate 990 and the carrier adhesive layer 980 may be removed and a bottom surface of the lower redistribution substrate 100 may be exposed. For example, bottom surfaces of the under-bump patterns 150 may be exposed. Solder terminals 500 may be formed on, and may correspond to, the bottom surfaces of the under-bump patterns 150. Accordingly, a semiconductor package 1 may be fabricated eventually.

Differently from the description of FIG. 5I, the grinding process of the preliminary upper molding layer 801 may stop before the first upper semiconductor chip 701 is exposed. In this case, a semiconductor package 1A discussed in FIG. 2A may be fabricated.

Figure 6:
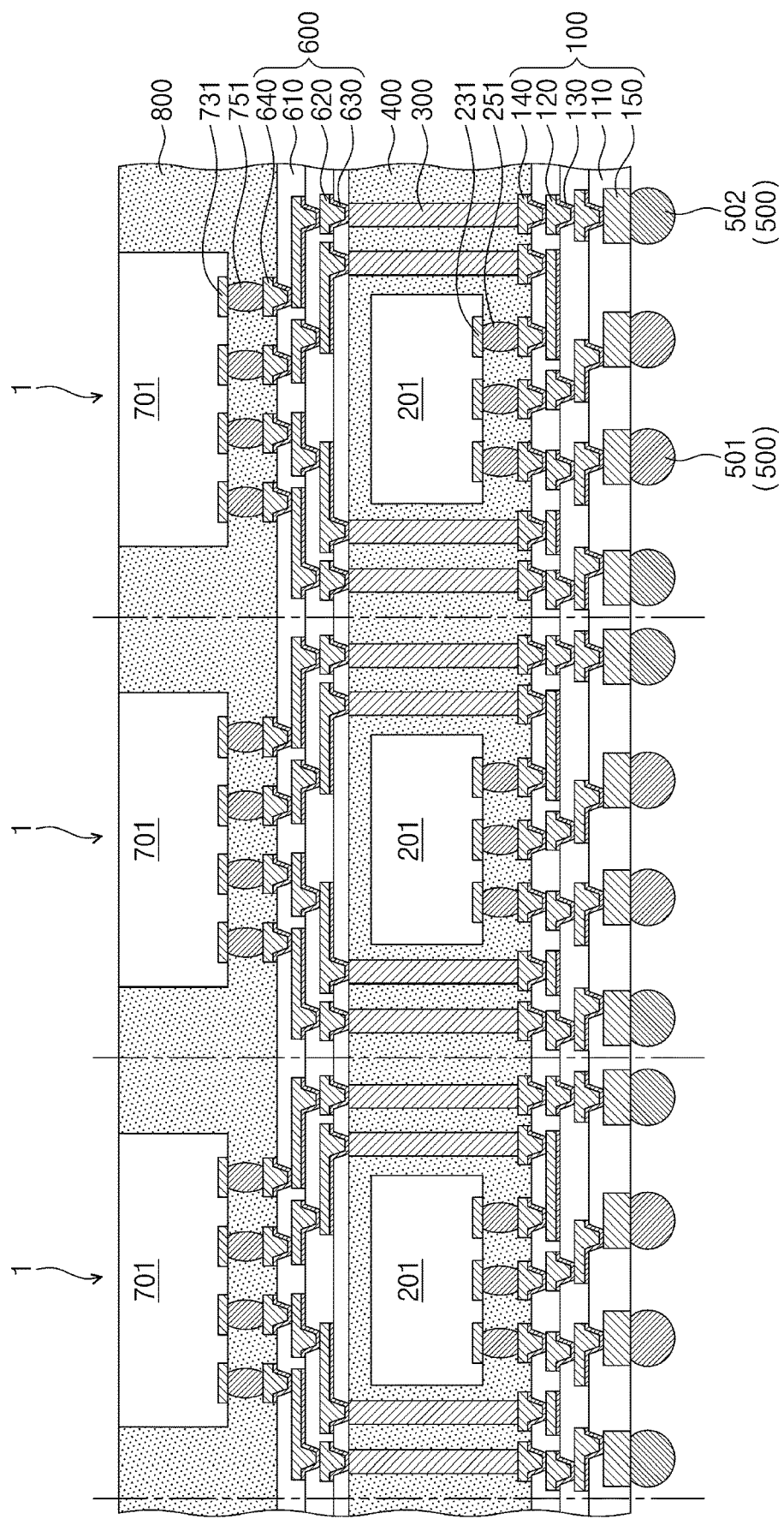
FIG. 6 is a cross-sectional view showing a method of fabricating a semiconductor package according to some example embodiments.

FIG. 6 is a cross-sectional view showing a method of fabricating a semiconductor package according to some example embodiments.

Referring to FIG. 6, a lower redistribution substrate 100 may be formed. The lower redistribution substrate 100 may include under-bump patterns 150, lower dielectric layers 110, redistribution patterns 120, seed patterns 130, and redistribution pads 140. The formation of the lower redistribution substrate 100 may be substantially the same as that discussed in FIGS. 5A and 5B. In contrast, the lower redistribution substrate 100 may be formed in a panel or wafer level.

A plurality of first lower semiconductor chips 201 may be provided on the lower redistribution substrate 100. The plurality of first lower semiconductor chips 201 may be laterally spaced apart from each other. First lower solder patterns 251 may be formed between the lower redistribution substrate 100 and the first lower semiconductor chips 201. Conductive structures 300 may be formed on the lower redistribution substrate 100. A lower molding layer 400 may be formed on the lower redistribution substrate 100 and may cover the first lower semiconductor chips 201 and sidewalls of the conductive structures 300. The lower molding layer 400 may expose top surfaces of the conductive structures 300.

An upper redistribution substrate 600 may be formed on the lower molding layer 400. The upper redistribution substrate 600 may include upper dielectric layers 610, upper redistribution layers 620, upper seed patterns 630, and upper redistribution pads 640. The formation of the upper redistribution substrate 600 may be substantially the same as that discussed in FIGS. 5F and 5G. In contrast, the upper redistribution substrate 600 may be formed in a panel or wafer level.

A plurality of first upper semiconductor chips 701 may be provided on the upper redistribution substrate 600. The plurality of first upper semiconductor chips 701 may be laterally spaced apart from each other. First upper solder patterns 751 may be correspondingly formed between the upper redistribution substrate 600 and the first upper semiconductor chips 701. An upper molding layer 800 may be formed on the upper redistribution substrate 600 and may cover sidewalls of the first upper semiconductor chips 701.

Solder terminals 500 may be formed on a bottom surface of the lower redistribution substrate 100 and may be coupled to the under-bump patterns 150.

The lower redistribution substrate 100, the lower molding layer 400, the upper redistribution substrate 600, and the upper molding layer 800 may be diced along dot-and-dash lines, which may result in fabricating a plurality of semiconductor packages 1 that are separated from each other. The semiconductor packages 1 may be formed in a panel or wafer level. Each of the semiconductor packages 1 may be the same as that discussed in the example of FIGS. 1A to 1D. For brevity of explanation, the following description refers to a single semiconductor package, except for the example of FIG. 6, but it is to be understood that the method of fabricating a semiconductor package is not necessarily limited to chip-level fabrication.

FIGS. 7A to 7D are cross-sectional views taken along line A'-B' of FIG. 3A, showing a method of fabricating a semiconductor package according to some example embodiments of the present inventive concepts.

Figure 7A:
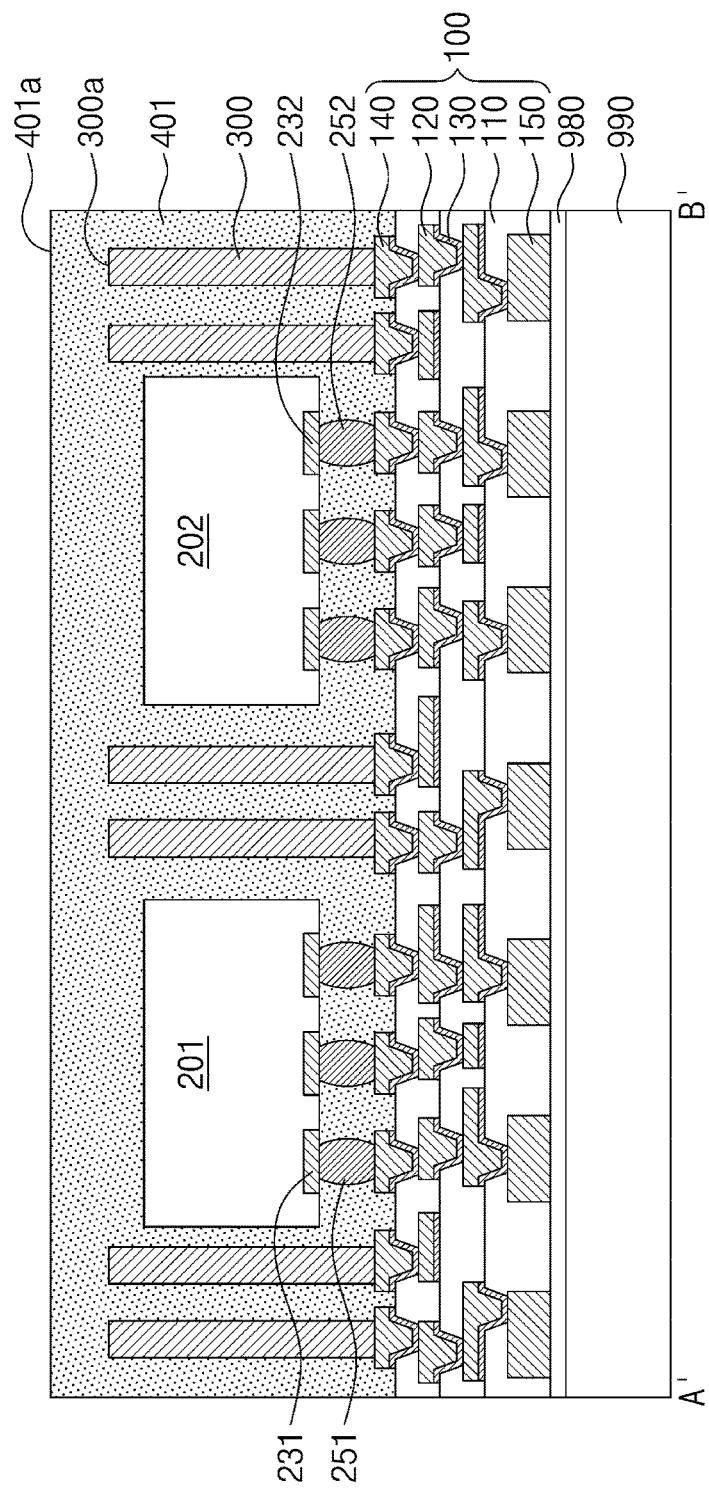
FIGS. 7A to 7D are cross-sectional views showing a method of fabricating a semiconductor package according to some example embodiments.

Referring to FIG. 7A, a lower redistribution substrate 100 may be formed on a carrier substrate 990. The formation of the lower redistribution substrate 100 may include forming under-bump patterns 150, lower dielectric layers 110, redistribution patterns 120, seed patterns 130, and redistribution pads 140. The formation of the lower redistribution substrate 100 may be substantially the same as that discussed in FIGS. 5A and 5B. A carrier adhesive layer 980 may further be interposed between the carrier substrate 990 and the lower redistribution substrate 100.

A first lower semiconductor chip 201 and a second lower semiconductor chip 202 may be mounted on the lower redistribution substrate 100. The first and second lower semiconductor chips 201 and 202 may be laterally spaced apart from each other. First lower solder patterns 251 may be formed between the lower redistribution substrate 100 and the first lower semiconductor chip 201. Second lower solder patterns 252 may be formed between the lower redistribution substrate 100 and the second lower semiconductor chip 202. Conductive structures 300 may be formed on the lower redistribution substrate 100 and may be coupled to corresponding redistribution pads 140.

A preliminary lower molding layer 401 may be formed on the lower redistribution substrate 100 and may cover sidewalls and top surfaces of the first and second lower semiconductor chips 201 and 202. The preliminary lower molding layer 401 may have a top surface 401a at a higher level than that of the top surface of the first lower semiconductor chip 201, that of the top surface of the second lower semiconductor chip 202, and that of top surfaces 300a of the conductive structures 300. The preliminary lower molding layer 401 may encapsulate the first lower solder patterns 251. The preliminary lower molding layer 401 may extend onto a bottom surface of the second lower semiconductor chip 202 and may encapsulate the second lower solder patterns 252.

Figure 7B:
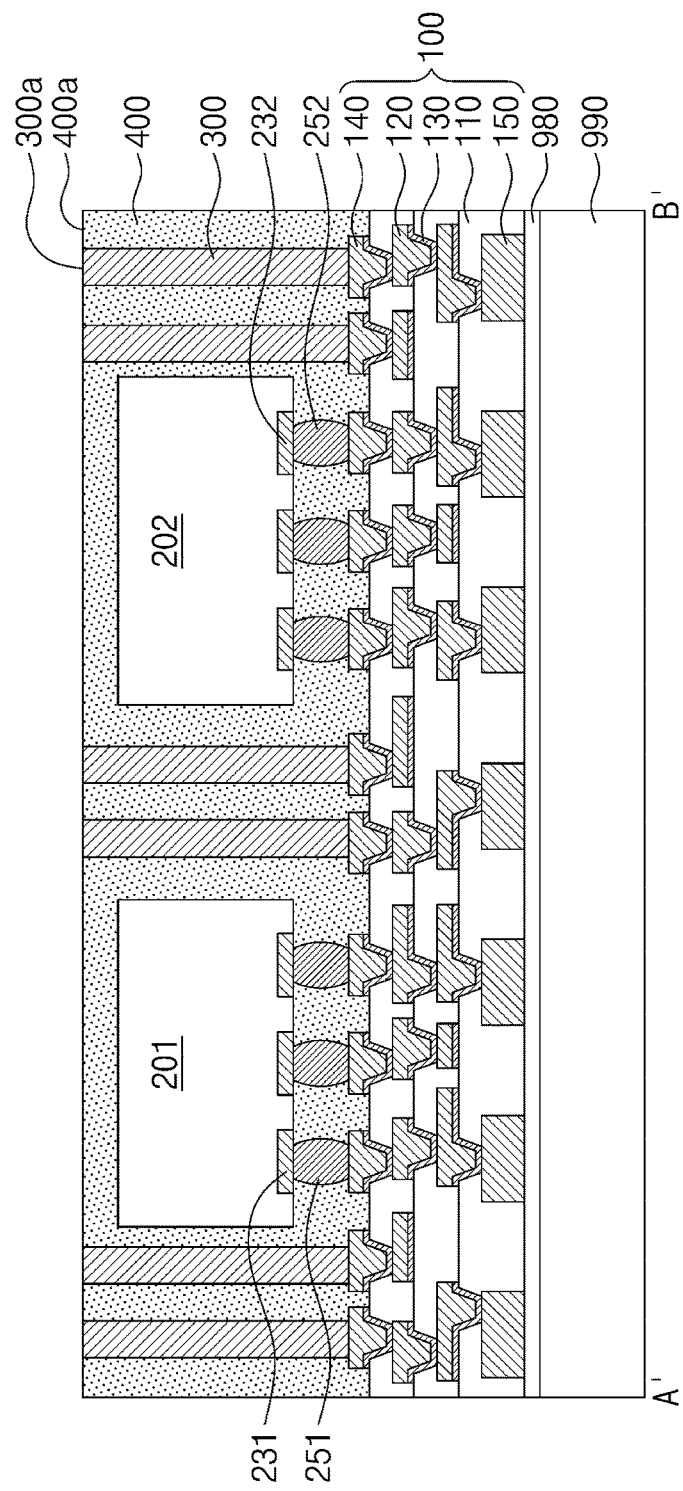

Referring to FIG. 7B, the preliminary lower molding layer 401 may undergo a grinding process to form a lower molding layer 400. The grinding process may stop after the conductive structures 300 are exposed. The lower molding layer 400 may have a top surface 400a that is coplanar with the top surfaces 300a of the conductive structures 300.

The grinding process may stop before exposure of the first and second lower semiconductor chips 201 and 202. Therefore, the conductive structures 300 may be prevented from being contaminated by grinding residues generated from the first lower semiconductor chip 201 and/or grinding reissues generated from the second lower semiconductor chip 202. After the termination of the grinding process, the top surface 400a of the lower molding layer 400 may be located at a higher level than that of the top surface of the first lower semiconductor chip 201 and that of the top surface of the second lower semiconductor chip 202, and the lower molding layer 400 may cover the top surfaces of the first and second lower semiconductor chips 201 and 202.

Figure 7C:
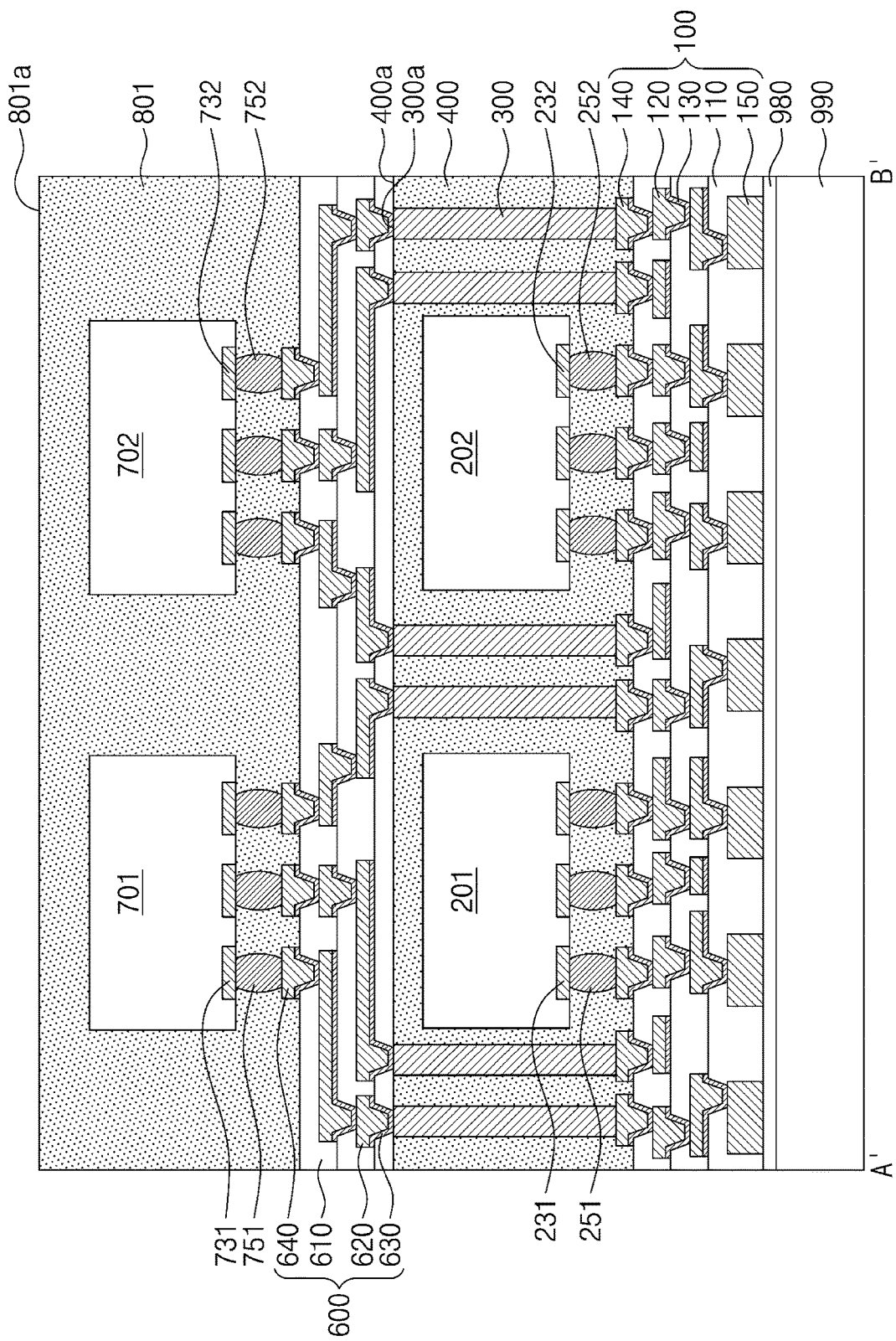

Referring to FIG. 7C, an upper redistribution substrate 600 may be formed on the top surface 400a of the lower molding layer 400. The formation of the upper redistribution substrate 600 may include forming upper dielectric layers 610, upper redistribution layers 620, upper seed patterns 630, and upper redistribution pads 640. The formation of the upper redistribution substrate 600 may be substantially the same as that discussed in FIGS. 5F and 5G.

A first upper semiconductor chip 701 and a second upper semiconductor chip 702 may be mounted on a top surface of the upper redistribution substrate 600. The first and second upper semiconductor chips 701 and 702 may be laterally spaced apart from each other. The mounting of the first upper semiconductor chip 701 may include forming first upper solder patterns 751. The mounting of the second upper semiconductor chip 702 may include forming second upper solder patterns 752 between second upper chip pads 732 and corresponding upper redistribution pads 640.

A preliminary upper molding layer 801 may be formed on the top surface of the upper redistribution substrate 600 and may cover the first upper semiconductor chip 701 and the second upper semiconductor chip 702. For example, the preliminary upper molding layer 801 may have a top surface 801a at a higher level than that of a top surface of the first upper semiconductor chip 701 and that of a top surface of the second upper semiconductor chip 702. The preliminary upper molding layer 801 may encapsulate the first upper solder patterns 751. The preliminary upper molding layer 801 may extend onto a bottom surface of the second upper semiconductor chip 702 and may encapsulate the second upper solder patterns 752.

Figure 7D:
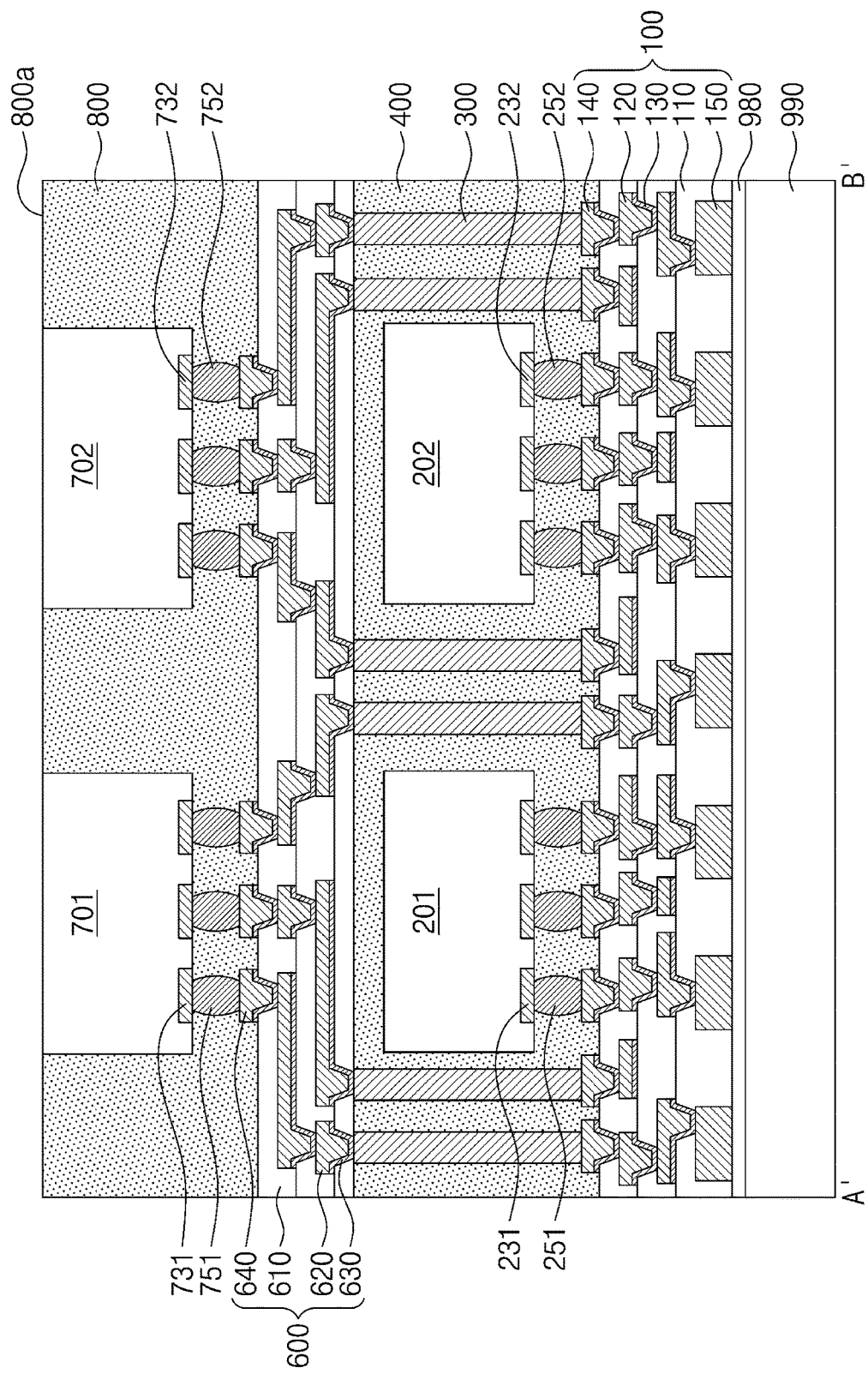

Referring to FIG. 7D, the preliminary upper molding layer 801 may undergo a grinding process to form an upper molding layer 800. The upper molding layer 800 may have a top surface 800a that is coplanar with the top surface of the first upper semiconductor chip 701 and the top surface of the second upper semiconductor chip 702.

Referring back to FIG. 3B, the carrier substrate 990 and the carrier adhesive layer 980 may be removed and may expose a bottom surface of the lower redistribution substrate 100. For example, bottom surfaces of the under-bump patterns 150 may be exposed. Solder terminals 500 may be formed on, and may correspond to, the bottom surfaces of the under-bump patterns 150. Accordingly, a semiconductor package 2 may be fabricated.

Differently from the description of FIG. 7D, the grinding process of the preliminary upper molding layer 801 may stop before the first and second upper semiconductor chips 701 and 702 are exposed. In this case, a semiconductor package 2A discussed in FIG. 4A may be fabricated.

According to the present inventive concepts, a lower semiconductor chip may be electrically connected to first solder terminals through a redistribution substrate. An upper semiconductor chip may be electrically connected to second solder terminals through an upper redistribution substrate and conductive structures. The redistribution substrate and the upper redistribution substrate may have small thicknesses, and thus the lower and upper semiconductor chips may have reduced electrical paths and a semiconductor package may decrease in size. The conductive structures may have lower resistivity to allow the upper semiconductor chip to have an increased operating speed. The lower and upper semiconductor chips may achieve an increase in thermal radiation.

This detailed description of the present inventive concepts should not necessarily be construed as limited to the embodiments set forth herein, and it is intended that the present inventive concepts cover the various combinations, the modifications and variations of this invention without departing from the spirit and scope of the present disclosure. Various elements of different example embodiments of the present inventive concepts may be combined with each other.

What is claimed is:

1. A semiconductor package, comprising:
a lower redistribution substrate;
a first lower semiconductor chip mounted on a top surface of the lower redistribution substrate;
a plurality of first lower solder patterns disposed between the lower redistribution substrate and the first lower semiconductor chip;
a plurality of conductive structures disposed on the top surface of the lower redistribution substrate and laterally spaced apart from the first lower semiconductor chip;
a lower molding layer disposed on the top surface of the lower redistribution substrate, the lower molding layer at least partially directly contacting sidewalls of the plurality of conductive structures and sidewalls of the plurality of first lower solder patterns and at least partially covering a top surface of the first lower semiconductor chip;
an upper redistribution substrate disposed on the lower molding layer and the plurality of conductive structures, the upper redistribution substrate being electrically connected to the plurality of conductive structures;
a first upper semiconductor chip mounted on a top surface of the upper redistribution substrate;
a plurality of first upper solder patterns disposed between the upper redistribution substrate and the first upper semiconductor chip; and
an upper molding layer at least partially covering a sidewall of the first upper semiconductor chip and exposing a top surface of the first upper semiconductor chip,
wherein the lower molding layer extends between the lower redistribution substrate and the first lower semiconductor chip,
wherein the upper molding layer extends between the upper redistribution substrate and the first upper semiconductor chip and covers sidewalls of the first upper solder patterns,
wherein a resistivity of the plurality of conductive structures is less than a resistivity of the plurality of first lower solder patterns,
wherein the number of the plurality of conductive structures is the same as or greater than the number of a plurality of first upper chip pads of the first upper semiconductor chip,
wherein the lower redistribution substrate includes:
a first redistribution pattern disposed in a lower dielectric layer, the first redistribution pattern including a first via portion and a first wire portion; and
a first seed pattern disposed on a bottom surface of the first redistribution pattern,
wherein a width of the first via portion at a top surface of the first via portion is greater than a width of the first via portion at a bottom surface of the first via portion, and
wherein the upper redistribution substrate includes:
a second redistribution layer disposed in an upper dielectric layer, the second redistribution layer including a second via pattern and a second wire pattern; and
a second seed pattern disposed on a bottom surface of the second redistribution layer,
wherein a width of the second via pattern at a top surface of the second via pattern is greater than a width of the second via pattern at a bottom surface of the second via pattern.

2. The semiconductor package of claim 1, further comprising:
a second lower semiconductor chip disposed on the top surface of the lower redistribution substrate and laterally spaced apart from the first lower semiconductor chip; and
a plurality of second lower solder patterns disposed between the lower redistribution substrate and the second lower semiconductor chip, wherein the plurality of conductive structures is disposed between the first lower semiconductor chip and the second lower semiconductor chip.

3. The semiconductor package of claim 2, wherein
the lower molding layer covers a top surface of the second lower semiconductor chip, and
the lower molding layer extends between the lower redistribution substrate and the second lower semiconductor chip and encapsulates the plurality of second lower solder patterns.

4. The semiconductor package of claim 2, further comprising:
a second upper semiconductor chip mounted on the upper redistribution substrate and laterally spaced apart from the first upper semiconductor chip; and
a plurality of second upper solder patterns disposed between the upper redistribution substrate and the second upper semiconductor chip,
wherein the upper molding layer extends onto a bottom surface of the second upper semiconductor chip and encapsulates the plurality of second upper solder patterns.

5. The semiconductor package of claim 4, wherein the number of the plurality of conductive structures is the same as or greater than a sum of the number of the plurality of first upper chip pads of the first upper semiconductor chip and the number of a plurality of second upper chip pads of the second upper semiconductor chip.

6. The semiconductor package of claim 5, wherein the number of the plurality of conductive structures is the same as or greater than a sum of the number of a plurality of first lower chip pads of the first lower semiconductor chip and the number of a plurality of second lower chip pads of the second lower semiconductor chip.

7. The semiconductor package of claim 1, wherein the first lower semiconductor chip includes a plurality of first lower chip pads disposed on a bottom surface of the first lower semiconductor chip,
wherein the plurality of first lower solder patterns is coupled to the plurality of first lower chip pads.

8. The semiconductor package of claim 1, further comprising:
a plurality of first solder terminals disposed on a bottom surface of the lower redistribution substrate; and
a plurality of second solder terminals disposed on the bottom surface of the lower redistribution substrate and insulated from the plurality of first solder terminals,
wherein the plurality of first solder terminals vertically overlap the first lower semiconductor chip,
wherein the plurality of first solder terminals have electrical connection with the first lower semiconductor chip, and
wherein the second solder terminals are spaced apart from the first lower semiconductor chip and are electrically connected to corresponding conductive structures of the plurality of conductive structures.

9. The semiconductor package of claim 1, wherein a thickness of the lower redistribution substrate is in a range of about 10 μm to about 50 μm.

10. The semiconductor package of claim 1, wherein
a width of the conductive structure is in a range of about 50 μm to about 250 μm, and
a pitch of the plurality of conductive structures is in a range of about 70 μm to about 350 μm.

11. A semiconductor package, comprising:
a lower redistribution substrate;
a first lower semiconductor chip mounted on a top surface of the lower redistribution substrate;
a plurality of first lower solder patterns disposed between the lower redistribution substrate and the first lower semiconductor chip;
a second lower semiconductor chip mounted on the top surface of the lower redistribution substrate;
a plurality of second lower solder patterns disposed between the lower redistribution substrate and the second lower semiconductor chip;
a conductive structure disposed on the top surface of the lower redistribution substrate;
a lower molding layer disposed on the top surface of the lower redistribution substrate, the lower molding layer at least partially covering a top surface of the first lower semiconductor chip and a top surface of the second lower semiconductor chip;
an upper redistribution substrate disposed on the lower molding layer and the conductive structure, the upper redistribution substrate being electrically connected to the conductive structure;
a first upper semiconductor chip mounted on the upper redistribution substrate;
a plurality of first upper solder patterns disposed between the upper redistribution substrate and the first upper semiconductor chip;
a second upper semiconductor chip mounted on the upper redistribution substrate and laterally spaced apart from the first upper semiconductor chip;
a plurality of second upper solder patterns disposed between the upper redistribution substrate and the second upper semiconductor chip; and
an upper molding layer disposed on a top surface of the upper redistribution substrate, the upper molding layer at least partially covering a sidewall of the first upper semiconductor chip and a sidewall of the second upper semiconductor chip,
wherein the lower molding layer extends onto a bottom surface of the first lower semiconductor chip and a bottom surface of the second lower semiconductor chip, and is in direct contact with the plurality of first lower solder patterns, the plurality of second lower solder patterns, and the conductive structure,
wherein the upper molding layer extends onto a bottom surface of the first upper semiconductor chip and a bottom surface of the second upper semiconductor chip and encapsulates the plurality of first upper solder patterns and the plurality of second upper solder patterns,
wherein the conductive structure is disposed between the first lower semiconductor chip and the second lower semiconductor chip,
wherein the lower redistribution substrate includes:
a lower dielectric layer;
a firstredistribution pattern disposed in the lower dielectric layer, the first redistribution pattern including a first via portion and a first wire portion; and
a first seed pattern disposed on a bottom surface of the first redistribution pattern, and
wherein the upper redistribution substrate includes:
an upper dielectric layer;
a second redistribution layer disposed in the upper dielectric layer, the second redistribution layer including a second via pattern and a second wire pattern; and
a second seed pattern disposed on a bottom surface of the second redistribution layer.

12. The semiconductor package of claim 11, wherein the conductive structure is one of a plurality of conductive structures on the top surface of the lower redistribution substrate,
   wherein at least one of the plurality of conductive structures is disposed between the first lower semiconductor chip and a first outer lateral surface of the lower redistribution substrate or between the second lower semiconductor chip and a second outer lateral surface of the lower redistribution substrate, and the second lower semiconductor chip is disposed between the first lower semiconductor chip and the second outer lateral surface of the lower redistribution substrate, and
   wherein the number of the plurality of conductive structures is the same as or greater than a sum of the number of a plurality of first upper chip pads of the first upper semiconductor chip and the number of a plurality of second upper chip pads of the second upper semiconductor chip.

13. The semiconductor package of claim 11, wherein a resistivity of the conductive structure is less than a resistivity of the plurality of first lower solder pattern and a resistivity of the second lower solder pattern.

14. The semiconductor package of claim 11, wherein
   a top surface of the lower molding layer is at a level substantially the same as a level of a top surface of the conductive structure, and
   a top surface of the upper molding layer is at a level substantially the same as a level of a top surface of the first upper semiconductor chip and a level of a top surface of the second upper semiconductor chip.

15. The semiconductor package of claim 11, wherein
   the lower dielectric layer includes a photo-imageable polymer, and
   the upper dielectric layer includes a photo-imageable polymer.

16. A semiconductor package, comprising:
   a lower redistribution substrate;
   a lower semiconductor chip mounted on a top surface of the lower redistribution substrate;
   a plurality of lower solder patterns disposed between the lower redistribution substrate and the lower semiconductor chip;
   a plurality of conductive structures disposed on the top surface of the lower redistribution substrate;
   a lower molding layer disposed on the top surface of the lower redistribution substrate, the lower molding layer at least partially covering a top surface of the lower semiconductor chip and at least partially contacting sidewalls of the plurality of conductive structures and sidewalls of the plurality of lower solder patterns;
   an upper redistribution substrate disposed on the lower molding layer and the plurality of conductive structures, the upper redistribution substrate being electrically connected to the plurality of conductive structures;
   an upper semiconductor chip mounted on a top surface of the upper redistribution substrate;
   a plurality of upper solder patterns disposed between the upper redistribution substrate and the upper semiconductor chip; and
   an upper molding layer disposed on the top surface of the upper redistribution substrate, the upper molding layer at least partially covering a sidewall of the upper semiconductor chip, wherein the lower molding layer extends between the lower redistribution substrate and the lower semiconductor chip,
   wherein the upper molding layer extends between the upper redistribution substrate and the upper semiconductor chip and encapsulates the plurality of upper solder patterns,
   wherein the number of the plurality of conductive structures is the same as or greater than the number of a plurality of upper chip pads of the upper semiconductor chip,
   wherein the lower redistribution substrate includes:
      a first redistribution pattern disposed in a lower dielectric layer, the first redistribution pattern including a first via portion and a first wire portion; and
      a first seed pattern disposed on a bottom surface of the first redistribution pattern, and
   wherein the lower dielectric layer includes a photo-imageable polymer,
   wherein the upper redistribution substrate includes:
      a second redistribution layer disposed in an upper dielectric layer, the second redistribution layer including a second via pattern and a second wire pattern; and
      a second seed layer disposed on a bottom surface of the second redistribution layer, and
   wherein the upper dielectric layer includes a photo-imageable polymer.

17. The semiconductor package of claim 16, wherein the lower semiconductor chip includes a plurality of lower chip pads disposed on a bottom surface of the lower semiconductor chip,
   wherein the plurality of lower solder patterns is coupled to the plurality of lower chip pads of the lower semiconductor chip, and
   wherein the lower molding layer is disposed between the top surface of the lower semiconductor chip and a bottom surface of the upper redistribution substrate.

18. The semiconductor package of claim 16, wherein a resistivity of the conductive structure is less than a resistivity of the plurality of lower solder pattern and a resistivity of the plurality of upper solder pattern.

19. The semiconductor package of claim 16, wherein the upper molding layer exposes a top surface of the upper semiconductor chip.

20. The semiconductor package of claim 16, wherein
   a width of the first via portion at a top surface of the first via portion is greater than a width of the first via portion at a bottom surface of the first via portion, and
   a width of the second via pattern at a top surface of the second via pattern is greater than a width of the second via pattern at a bottom surface of the second via pattern.

* * * * *